US009859015B2

(12) United States Patent
Kim et al.

(10) Patent No.: US 9,859,015 B2
(45) Date of Patent: Jan. 2, 2018

(54) NON-VOLATILE MEMORY DEVICE AND MEMORY SYSTEM INCLUDING THE SAME

(71) Applicants: Tae-Hyun Kim, Seoul (KR); Bong-Soon Lim, Seoul (KR); Yoon-Hee Choi, Hwaseong-si (KR); Sang-Won Shim, Seoul (KR)

(72) Inventors: Tae-Hyun Kim, Seoul (KR); Bong-Soon Lim, Seoul (KR); Yoon-Hee Choi, Hwaseong-si (KR); Sang-Won Shim, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/251,345

(22) Filed: Aug. 30, 2016

(65) Prior Publication Data
US 2017/0117055 A1 Apr. 27, 2017

(30) Foreign Application Priority Data
Oct. 23, 2015 (KR) ........................ 10-2015-0148025

(51) Int. Cl.
| | | |
|---|---|---|
| *G11C 16/04* | (2006.01) | |
| *G11C 16/34* | (2006.01) | |
| *G11C 16/08* | (2006.01) | |
| *G11C 16/26* | (2006.01) | |
| *G11C 16/10* | (2006.01) | |
| *G06F 11/10* | (2006.01) | |
| *G11C 29/52* | (2006.01) | |

(52) U.S. Cl.
CPC .......... *G11C 16/3459* (2013.01); *G11C 16/08* (2013.01); *G11C 16/10* (2013.01); *G11C 16/26* (2013.01); *G06F 11/1068* (2013.01); *G11C 29/52* (2013.01)

(58) Field of Classification Search
CPC . G06F 11/1068; G11C 16/26; G11C 16/0483; G11C 16/08; G11C 16/10; G11C 16/3459; G11C 11/5642; G11C 11/5628; G11C 13/0069; G11C 16/3445; G11C 11/1673; G11C 11/1675; G11C 13/0064; G11C 15/046
See application file for complete search history.

(56) References Cited

U.S. PATENT DOCUMENTS

| | | |
|---|---|---|
| 7,024,598 B2 | 4/2006 | Jeong et al. |
| 7,317,636 B2 | 1/2008 | Ide et al. |
| 7,746,703 B2 | 6/2010 | Kim et al. |
| 8,270,215 B2 | 9/2012 | You et al. |

(Continued)

*Primary Examiner* — Uyen B Tran
(74) *Attorney, Agent, or Firm* — Volentine & Whitt, PLLC

(57) ABSTRACT

A memory device has a memory cell array with memory cells. A page buffer group generates page buffer signals according to a verify read result of the memory cells. A page buffer decoding unit generates a decoder output signal corresponding to the number of fail bits from the page buffer signals based on a first reference current. A slow bit counter outputs a count result corresponding to the number of fail bits from the decoder output signal based on a second reference current corresponding to M times the first reference current, where M is a positive integer. A pass/fail checking unit determines a program outcome with respect to the memory cells based on the count result and outputs a pass signal or a fail signal based on the determined program outcome.

14 Claims, 25 Drawing Sheets

(56) References Cited

U.S. PATENT DOCUMENTS

| | | |
|---|---|---|
| 8,427,871 B2 | 4/2013 | Han et al. |
| 8,661,294 B2 | 2/2014 | Lee et al. |
| 8,897,069 B2 | 11/2014 | Choi |
| 9,064,582 B2 | 6/2015 | Song et al. |
| 2012/0314500 A1* | 12/2012 | Song .................. G11C 16/3459 365/185.12 |
| 2014/0001530 A1* | 1/2014 | Song ...................... H01L 29/78 257/314 |
| 2014/0003167 A1 | 1/2014 | Jung |
| 2014/0376316 A1 | 12/2014 | Chen et al. |

\* cited by examiner

NON-VOLATILE MEMORY DEVICE AND MEMORY SYSTEM INCLUDING THE SAME

CROSS-REFERENCE TO RELATED APPLICATION

This application claims the benefit of Korean Patent Application No. 10-2015-0148025, filed on Oct. 23, 2015, in the Korean Intellectual Property Office, the disclosure of which is incorporated herein in its entirety by reference.

BACKGROUND

The disclosure relates to a memory device, and more particularly, to a non-volatile memory device, a memory system including the non-volatile memory device, a method of operating the non-volatile memory device, and a method of performing a program verify operation in the non-volatile memory device.

Memory devices are used to store data and are classified into volatile memory devices and non-volatile memory devices. A flash memory device, which is an example of a non-volatile memory device, may be used in mobile phones, digital cameras, personal digital assistants (PDAs), mobile computer devices, fixed computer devices, and other devices.

SUMMARY

According to an aspect of the disclosure, there is provided a non-volatile memory device including a memory cell array having memory cells. A page buffer group generates page buffer signals according to a verify read result of the memory cells. A page buffer decoding unit generates a decoder output signal corresponding to the number of fail bits from the page buffer signals based on a first reference current. A slow bit counter outputs a count result corresponding to the number of fail bits from the decoder output signal based on a second reference current corresponding to M times the first reference current, where M is a positive integer. A pass/fail checking unit determines a program outcome with respect to the memory cells based on the count result and outputs a pass signal or a fail signal based upon the determined program outcome.

According to another aspect of the disclosure, there is provided a memory system including a non-volatile memory device and a memory controller configured to control the non-volatile memory device. The non-volatile memory device includes a memory cell array having memory cells, a page buffer group, a page buffer decoding unit, a slow bit counter, and a pass/fail checking unit. The page buffer group generates page buffer signals according to a verify read result of the memory cells. The page buffer decoding unit generates a decoder output signal corresponding to the number of fail bits from the page buffer signals, based on a first reference current. The slow bit counter outputs a count result corresponding to the number of fail bits from a decoder output signal based on a second reference current corresponding to M times the first reference current, where M is a positive integer. The pass/fail checking unit determines a program outcome with respect to the memory cells based on the count result and outputs a pass signal or a fail signal based on the program outcome.

According to another aspect of the disclosure, there is provided a non-volatile memory device including a memory cell array having memory cells. A page buffer executes a read operation on the memory cells to determine the number of memory cells that have not been programmed to a predetermined voltage and multiplies the amplitude of a first reference current by the determined number to generate an output signal. A counter outputs a count of the number of memory cells that have not been programmed to the predetermined voltage based upon a comparison of the output signal and a second reference current having an amplitude that is M times the amplitude of the first reference current, where M is an integer greater than zero. A pass/fail checking unit informs a memory controller whether the count exceeds a predetermined value.

BRIEF DESCRIPTION OF THE DRAWINGS

Embodiments of the disclosure will be more clearly understood from the following detailed description taken in conjunction with the accompanying drawings in which.

DETAILED DESCRIPTION OF THE EMBODIMENTS

Figure 1:
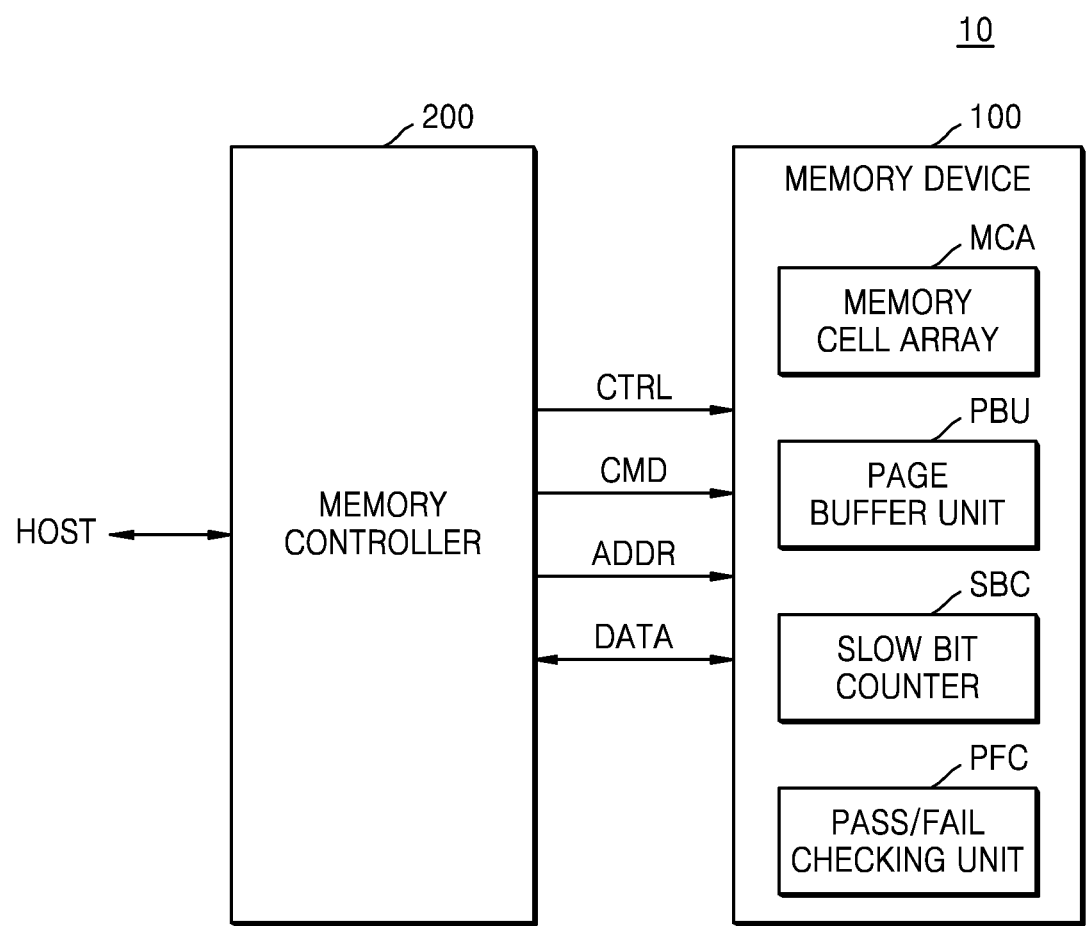
FIG. 1 is a schematic block diagram of a memory system according to an embodiment of the disclosure.

Hereinafter, embodiments of the disclosure will now be described more fully with reference to the accompanying drawings, in which embodiments of the disclosure are shown. These embodiments are provided so that this disclosure will be thorough and complete and will fully convey the disclosure to those of ordinary skill in the art. The disclosure may, however, be embodied in many different forms and should not be construed as being limited to the embodiments set forth herein. The above embodiments should be understood to cover all modifications, equivalents, and alternatives falling within the scope of the disclosure. The same reference numerals represent the same elements throughout the drawings. In the drawings, the sizes of structures may be exaggerated or reduced for clarity.

The terminology used herein is for the purpose of describing embodiments only and is not intended to be limiting of the disclosure. As used herein, the singular forms 'a', 'an' and 'the' are intended to include the plural forms as well, unless the context clearly indicates otherwise. It will be further understood that the terms 'comprise' and/or 'comprising,' when used in this specification, specify the presence of stated features, integers, steps, operations, elements, and/or components, but do not preclude the presence or addition of one or more other features, integers, steps, operations, elements, components, and/or groups thereof.

It will be understood that, although the terms 'first', 'second', 'third,' etc., may be used herein to describe various elements, components, regions, layers and/or sections, these elements, components, regions, layers and/or sections should not be limited by these terms. These terms are only used to distinguish one element from another element. Thus, a first element discussed below could be termed a second element without departing from the scope of the disclosure.

Unless otherwise defined, all terms (including technical and scientific terms) used herein have the same meaning as commonly understood by one of ordinary skill in the art to which the disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein, the term "and/or" includes any and all combinations of one or more of the associated listed items. Expressions such as "at least one of," when preceding a list of elements, modify the entire list of elements and do not modify the individual elements of the list.

FIG. 1 is a schematic block diagram of a memory system according to an embodiment of the disclosure.

Referring to FIG. 1, a memory system 10 may include a memory device 100 and a memory controller 200. The memory device 100 may include a memory cell array MCA, a page buffer unit PBU, a slow bit counter SBC, and a pass/fail checking unit PFC.

The memory controller 200 may control the memory device 100 to read data from or write data to the memory device 100 in response to a read/write command received from a host, HOST. In detail, the memory controller 200 may control a program (or write) operation, a read operation, and an erase operation on the memory device 100 by providing the memory device 100 with an address ADDR, a command CMD, and a control signal CTRL. Also, data DATA for the program operation and read data DATA may be exchanged between the memory controller 200 and the memory device 100.

The memory cell array MCA may include a plurality of memory cells. For example, the plurality of memory cells may be flash memory cells. Hereinafter, embodiments of the disclosure will be described with respect to the plurality of memory cells which are NAND flash memory cells. However, the disclosure is not limited thereto, and the plurality of memory cells may be resistive memory cells, such as resistive random access memory (RRAM) cells, phase-change RAM (PRAM) cells or magnetic RAM (MRAM) cells in another embodiment of the disclosure.

In some embodiments, the memory cell array MCA may include a two-dimensional memory cell array and a plurality of cell strings arranged in row and column directions, which will be described later with reference to FIG. 4. In some embodiments, the memory cell array MCA may include a three-dimensional (3D) memory cell array including a plurality of NAND strings, each including memory cells respectively connected to word lines vertically stacked on a substrate. The memory cell array MCA will be described with reference to FIGS. 5 and 6.

The 3D memory array is monolithically formed in at least one physical level of arrays of memory cells having an active area disposed above a silicon substrate and circuitry associated with the operation of those memory cells. Such associated circuitry is above or within such substrate. The term "monolithic" means that layers of each level of the array are directly deposited on the layers of each underlying level of the array.

In an embodiment of the present disclosure, the 3D memory array includes vertical NAND strings that are vertically oriented such that at least one memory cell is located over another memory cell. The at least one memory cell may include a charge trap layer. The following patent documents, which are hereby incorporated by reference, describe suitable configurations for three-dimensional memory arrays, in which the three-dimensional memory array is configured as a plurality of levels, with word lines and/or bit lines shared between levels: U.S. Pat. Nos. 7,679,133; 8,553,466; 8,654,587; and 8,559,235 and US Pat. Pub. No. 2011/0233648. Also, US Pat. Pub. No. 2014/0376312 is incorporated herein by reference.

The page buffer unit PBU may store a verify read result about memory cells and may output page buffer signals according to the stored verify read result. When a program voltage is applied to selected word lines connected to selected memory cells included in the memory cell array MCA and then a program verify voltage is applied thereto, the verify read result may correspond to a voltage of bit lines connected to the selected memory cells. Also, the page buffer unit PBU may generate a decoder output signal corresponding to the number of fail bits from the page buffer signals based on a first reference current.

The slow bit counter SBC may output a count result corresponding to the number of fail bits from the decoder output signal based on a second reference current corresponding to M times the first reference current (where M is a positive integer). The pass/fail checking unit PFC may determine whether memory cells have passed a program based on the count result, so as to output a pass signal or a fail signal. Hereinafter, operations of the slow bit counter SBC and the pass/fail checking unit PFC will be described below with reference to FIG. 2.

Figure 2:
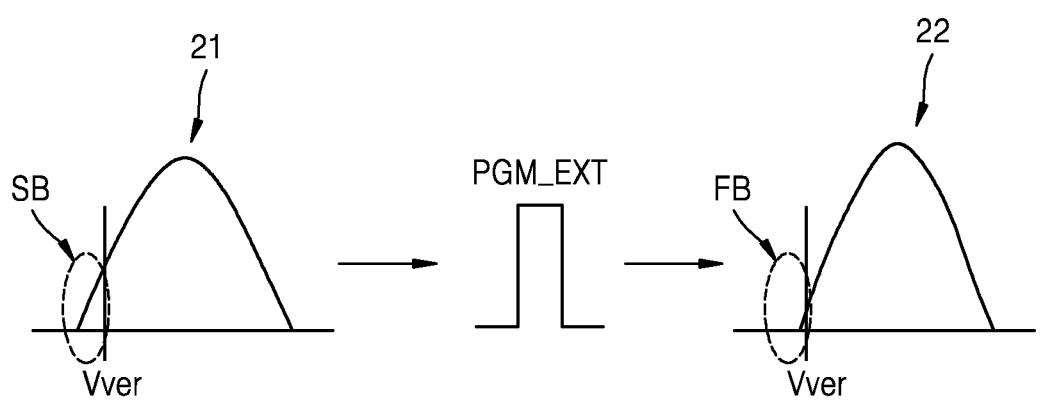
FIG. 2 illustrates a slow bit bypass method according to an embodiment of the disclosure.

FIG. 2 illustrates a slow bit bypass method according to an embodiment of the disclosure.

Referring to FIG. 2, in a program loop on selected memory cells, a program operation is performed by applying a program voltage or a program pulse to the selected memory cells and then a program verify operation may be performed by applying a program verify voltage Vver or a program verify pulse to the selected memory cells. Bits having a threshold voltage lower than the program verify voltage Vver in a first distribution 21 may be regarded as not program-passed and may be referred to as "slow bits SB."

Slow cells refer to memory cells having a relatively low program speed, and fast cells refer to memory cells having a relatively high program speed. Thus, when an identical program voltage is applied, a threshold voltage of the slow cells may be lower than a threshold voltage of fast cells. Slow bits SB having a threshold voltage lower than a program verify voltage Vver may correspond to slow cells, and bits having a threshold voltage equal to or higher than the program verify voltage Vver may correspond to normal cells or fast cells.

According to the present embodiment, when the number of slow bits SB is less than a reference number of bits in the first distribution 21, a program verify operation may be omitted in a next program loop, and this may be referred to as "a slow bit bypass method." The reference number of bits may be determined based on the number of fail bits within a range allowed according to error correction code (ECC). In detail, the reference number of bits may be an arbitrary number that is more than the number of fail bits within a range allowed according to ECC.

In detail, an extra program operation may be performed by applying an extra program pulse PGM_EXT to memory cells having the first distribution 21, and then, the program operation mode may be ended without performing an extra program verify operation by omitting applying an extra program verify pulse. Accordingly, in a second distribution 22 of the memory cells on which the extra program operation is completed, bits having a threshold voltage lower than the program verify voltage Vver may be equal to or less than a range allowed according to ECC, and may be referred to as "fail bits FB." The fail bits may be corrected according to an ECC operation.

According to the slow bit bypass method of the present embodiment, when the number of slow bits SB is less than the reference number of bits, the final number of fail bits FB may be reduced by applying an extra program pulse, so that the burden of an ECC operation may be reduced. In addition, when the number of slow bits SB is less than the reference number of bits, a program verify operation may be omitted to thereby reduce the total period of time of performing a program.

When a program pulse is applied to memory cells in an erased state, a threshold voltage of the memory cells is increased, and a width of a distribution of the memory cells may be referred to as a "one-shot threshold voltage distribution." Due to the recent development in processing techniques, the one-shot threshold voltage distribution may be reduced, and an interval between program pulses that are sequentially applied in an incremental step pulse programming (ISPP) method, that is, an incremental amount of a step may be increased.

Accordingly, in order to use the slow bit bypass method, the number of slow bits to be counted in a slow bit counting operation is increased. However, the number of slow bits to be counted may be, for examples, several thousand bits. When the number of slow bits to be counted in a slow bit counting operation is increased, a period of time for counting may be increased, and power consumption for the counting may be increased. Moreover, the number of transistors for implementing a counting circuit may be increased or a size of each transistor may be increased, and thus, circuit complexity and costs for implementing circuits may also be increased.

Figure 3:
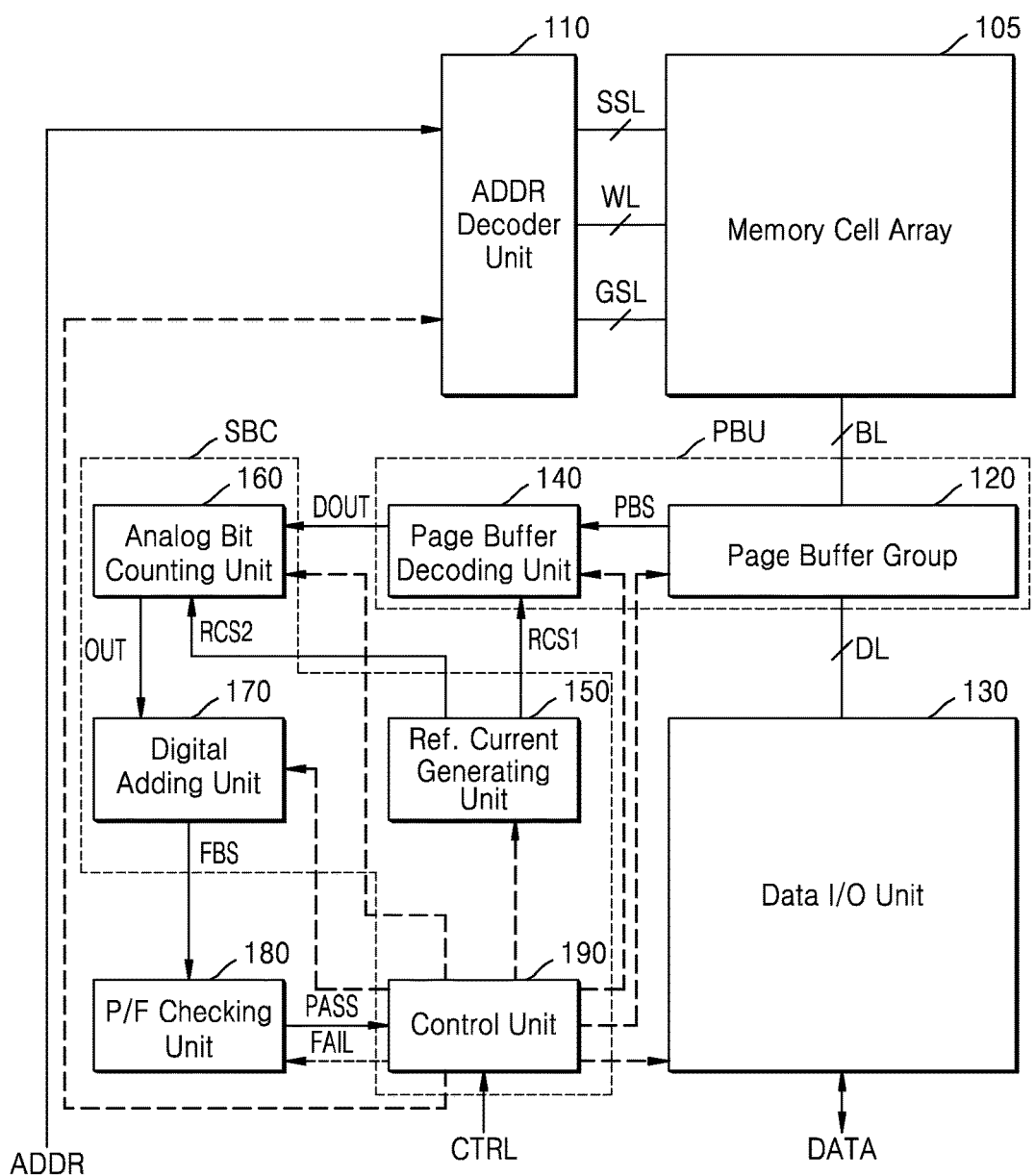
FIG. 3 is a detailed block diagram of a memory device according to an embodiment of the disclosure.

FIG. 3 is a detailed block diagram of a memory device 100 according to an embodiment of the disclosure.

Referring to FIG. 3, the memory device 100 may include a memory cell array 105, an address decoding unit 110, a page buffer group 120, a data input/output unit 130, a page buffer decoding unit 140, a reference current generating unit 150, an analog bit counting unit 160, a digital adding unit 170, a pass/fail checking unit 180, and a controller 190. The memory cell array 105 may correspond to the memory cell array MCA of FIG. 1, and the page buffer group 120 and the page buffer decoding unit 140 may correspond to the page buffer unit PBU of FIG. 1. In addition, the reference current generating unit 150, the analog bit counting unit 160, the digital adding unit 170, and the controller 190 may correspond to the slow bit counter SBC of FIG. 1, and the pass/fail checking unit 180 may correspond to the pass/fail checking unit PFC.

The memory cell array 105 may include a plurality of memory cells, and may be connected to word lines WL, string selection lines SSL, ground selection lines GSL, and bit lines BL. In detail, the memory cell array 105 may be connected to the address decoding unit 110 via the word lines WL, the string selection lines SSL, and the ground selection lines GSL, and may be connected to the page buffer group 120 via the bit lines BL.

In some embodiments, each memory cell included in the memory cell array 105 may store one or more bits. In detail, memory cells included in the memory cell array 105 may be used as a single-level cell, a multi-level cell, or a triple-level cell according to a storage mode. In some embodiments, some of a plurality of memory blocks included in the memory cell array 105 may be single-level cell blocks, and the other blocks may be multi-level cell blocks or triple-level cell blocks.

The address decoding unit 110 is configured to receive an address ADDR from the outside (for example, from a host HOST of FIG. 1) and decode the received address ADDR. The address decoding unit 110 may select some of the word lines WL in response to the address ADDR and control of the controller 190. In addition, the address decoding unit 110 may select some of the string selection lines SSL or some of the ground selection line GSL in response to the address ADDR and control of the controller 190.

The page buffer group 120 may be connected to the memory cell array 105 via the bit lines BL, and may be connected to the data input/output unit 130 via data lines DL. The page buffer group 120 operates in response to control of the controller 190. In an embodiment, the page buffer group 120 may program data received from the data input/output unit 130 to the memory cell array 105. Also, the page buffer group 120 may read data from the memory cell array 105 and output the data to the data input/output unit 130.

According to the present embodiment, the page buffer group 120 may store a verify read result regarding the memory cells, generate page buffer signals PBS according to the stored verify read result, and provide the page buffer decoding unit 140 with the page buffer signals PBS. In detail, the page buffer group 120 may output information about a verify read result as a page buffer signal PBS in response to a transmission signal transmitted from the controller 190. In an embodiment, the page buffer group 120 may output a verify read result as a page buffer signal PBS several times in response to a transmission signal.

The data input/output unit 130 is connected to the page buffer group 120 via the data lines DL. The data input/output unit 130 operates according to control of the controller 190. The data input/output unit 130 may exchange data DATA with the outside. The data input/output unit 130 may transmit data DATA received from the outside to the page buffer group 120 and may output data received from the page buffer group 120 to the outside.

The page buffer decoding unit 140 may generate a decoder output signal DOUT corresponding to the number of fail bits from page buffer signals PBS based on a first reference current. In detail, the page buffer decoding unit 140 may receive a page buffer signal PBS from the page buffer group 120 and receive a first reference current signal RCS1 from the reference current generating unit 150. The page buffer decoding unit 140 may detect fail bit information from the received page buffer signal PBS and output a detection result as a decoder output signal DOUT. The page buffer decoding unit 140 may operate in response to a decoder enable signal and a decoder precharge signal received from the controller 190.

In an embodiment, the page buffer decoding unit 140 may detect the number of fail bits from a page buffer signal PBS. The page buffer decoding unit 140 may output, as a decoder output signal DOUT, a current corresponding to a multiple of a first reference current RC1 given by the number of detected fail bits. For example, when a page buffer signal PBS indicates two fail bits, the page buffer decoding unit 140 may output double the first reference current RC1 as a decoder output signal DOUT (e.g., DOUT=2*RC1). The first reference current RC1 may be a current flowing through a decoding transistor when the first reference current signal RCS1 is applied to a gate of a decoding transistor included in the page buffer decoding unit 140.

The reference current generating unit 150 may generate the first reference current signal RCS1 corresponding to a first reference current and generate a second reference current signal RCS2 corresponding to a second reference current in response to control of the controller 190. According to the present embodiment, the second reference current may be M times the first reference current, and M may be a positive integer. For example, the reference current generating unit 150 may generate first and second reference current signals RCS1 and RCS2 in response to a reference voltage, a reference current enable signal, a reference current enable inverse signal, a maximum current enable signal, and a current option signal received from the controller 190.

The first reference current signal RCS1 may be provided to the page buffer decoding unit 140, and the second reference current signal RCS2 may be provided to the analog bit counting unit 160. Here, the first reference current RC1 may correspond to a decoding output signal DOUT when a page buffer signal PBS indicates one fail bit. Here, the second reference current RC2 may be a reference current for the analog bit counting unit 160 to detect M fail bits.

The analog bit counting unit 160 may receive the decoding output signal DOUT from the page buffer decoding unit 140 and the second reference current signal RCS2 from the reference current generating unit 150. The analog bit counting unit 160 may count the decoding output signal DOUT in response to control of the controller 190 (for example, by analog counting) and output a count result OUT. For example, the analog bit counting unit 160 may count the decoding output signal DOUT in response to a load enable signal and a count enable signal received from the controller 190 and output the count result OUT.

According to the present embodiment, the analog bit counting unit 160 may count the decoding output signal DOUT by using the second reference current signal RCS2. For example, the analog bit counting unit 160 may count how many multiples of the second reference current RC2 the decoder output signal DOUT corresponds to, by using the second current signal RCS2.

The digital adding unit 170 may receive the count result OUT from the analog bit counting unit 160 and digitalize and store the received count result OUT. The digital adding unit 170 may operate in response to a latch signal and a reset signal received from the controller 190. Also, the digital adding unit 170 may digitalize a plurality of output signals of the analog bit counting unit 160, calculate a cumulative sum of digitalized values, and output a stored signal as a fail bit signal FBS. The fail bit signal FBS may indicate the number of fail bits of a verify read result, and the fail bit signal FBS may be a digital value.

The pass/fail checking unit 180 may receive the fail bit signal FBS from the digital adding unit 170 and may output a pass signal PASS or a fail signal FAIL based on the fail bit signal FBS. The pass/fail checking unit 180 may operate according to control of the controller 190. When the fail bit signal FBS is equal to or less than a bypass value, the pass/fail checking unit 180 may output the pass signal PASS. When the fail bit signal FBS is greater than a bypass value, the pass/fail checking unit 180 may output the fail signal FAIL.

The controller 190 is configured to control overall operations of the memory device 100. For example, a control path of the controller 190 is illustrated by a dashed line. The controller 190 may operate in response to a control signal CTRL received from the outside. The controller 190 may control elements included in the memory device 100 to perform a slow bit counting operation on a verify read result according to a program verify operation of a previous program loop while a program voltage is applied in a present program loop.

In addition, the controller 190 may receive the pass signal PASS or the fail signal FAIL from the pass/fail checking unit 180. When the pass signal PASS is received, the controller 190 may determine a program pass and may control the address decoding unit 110 and the page buffer group PBU to omit a program verify operation in a next program loop. When the fail signal FAIL is received, the controller 190 may determine a program fail and may control the address decoding unit 110 and the page buffer group PBU to perform a program verify operation in a next program loop.

Figure 4:
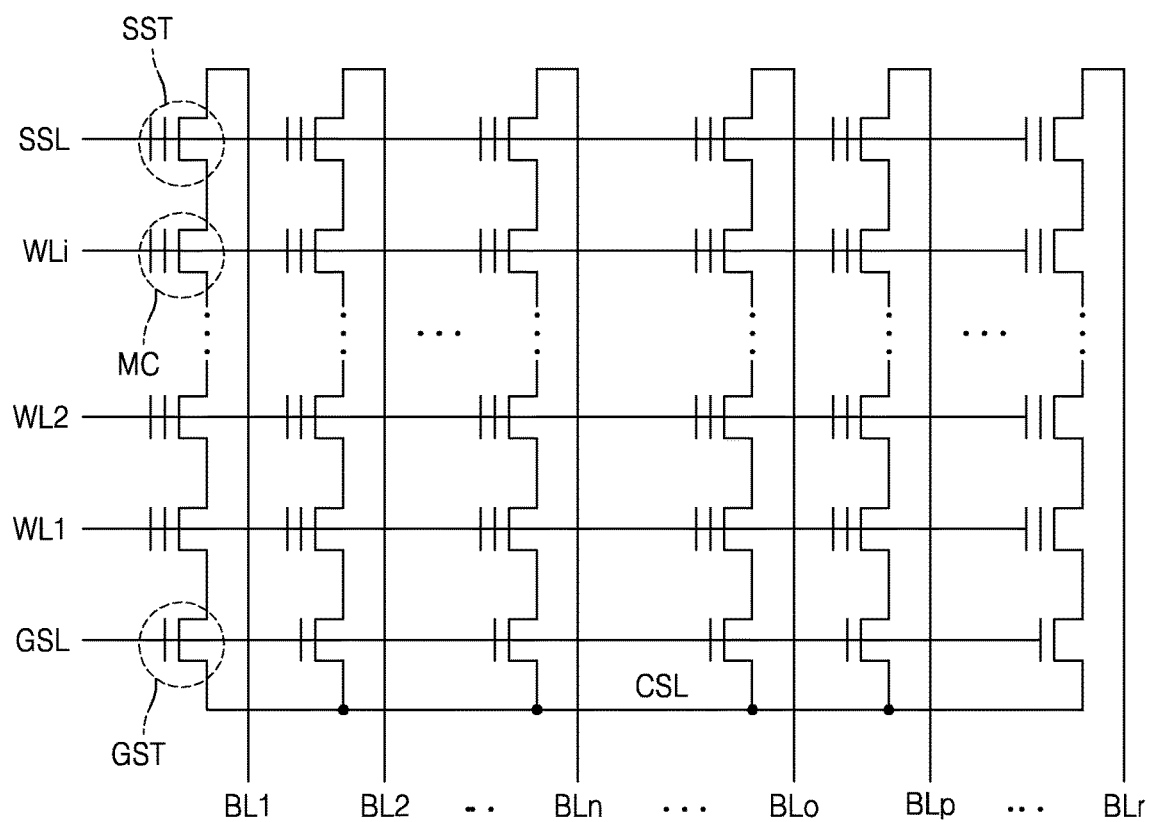
FIG. 4 is a circuit diagram illustrating an example of a memory cell array of FIG. 3.

FIG. 4 is a circuit diagram illustrating a memory cell array 105a which is an example of the memory cell array 105 of FIG. 3.

Referring to FIG. 4, the memory cell array 105a may include a plurality of strings, and each string may include a plurality of memory cells MC that are serially connected to one another. A string selection transistor SST and a ground selection transistor GST are connected to two ends of each string. A string selection line SSL is connected to gates of the string selection transistors SST, and a ground selection line GSL is connected to gates of the ground selection transistors GST. A common source line CSL is connected to first ends of the ground selection transistors GST. Word lines WL1 through WLi are respectively connected to control gates of the memory cells MC arranged in a column direction. Bit lines BL1 through BLr are respectively connected to first ends of the string selection transistors SST.

In a verify read operation, a power voltage VCC is charged to the bit lines BL1 through BLr. A verify voltage is supplied to a selected word line, and a high voltage is supplied to the string selection line SSL, the ground selection line GSL, and non-selected word lines. A ground voltage VSS is supplied to the common source line CSL. Memory cells, the string selection transistors SST, and the ground selection transistors GST connected to the non-selected word lines are turned on. Memory cells connected to the selected word line may be turned on or turned off.

In detail, when a threshold voltage of the selected memory cell is higher than a verify voltage, the selected memory cell is turned off. Accordingly, a bit line connected to the selected memory cell may be floated, and maintains the power voltage VCC. Meanwhile, when a threshold voltage of the selected memory cell is lower than a verify voltage, the selected memory cell is turned on. Accordingly, a ground voltage VSS is supplied from the common source line CSL to the bit line connected to the selected memory cell. As such, a bit line connected to a program-passed memory cell may be logic low, that is, a ground voltage VSS, and a bit line connected to a program-failed memory cell may be logic high, that is, a power voltage VCC.

Figure 5:
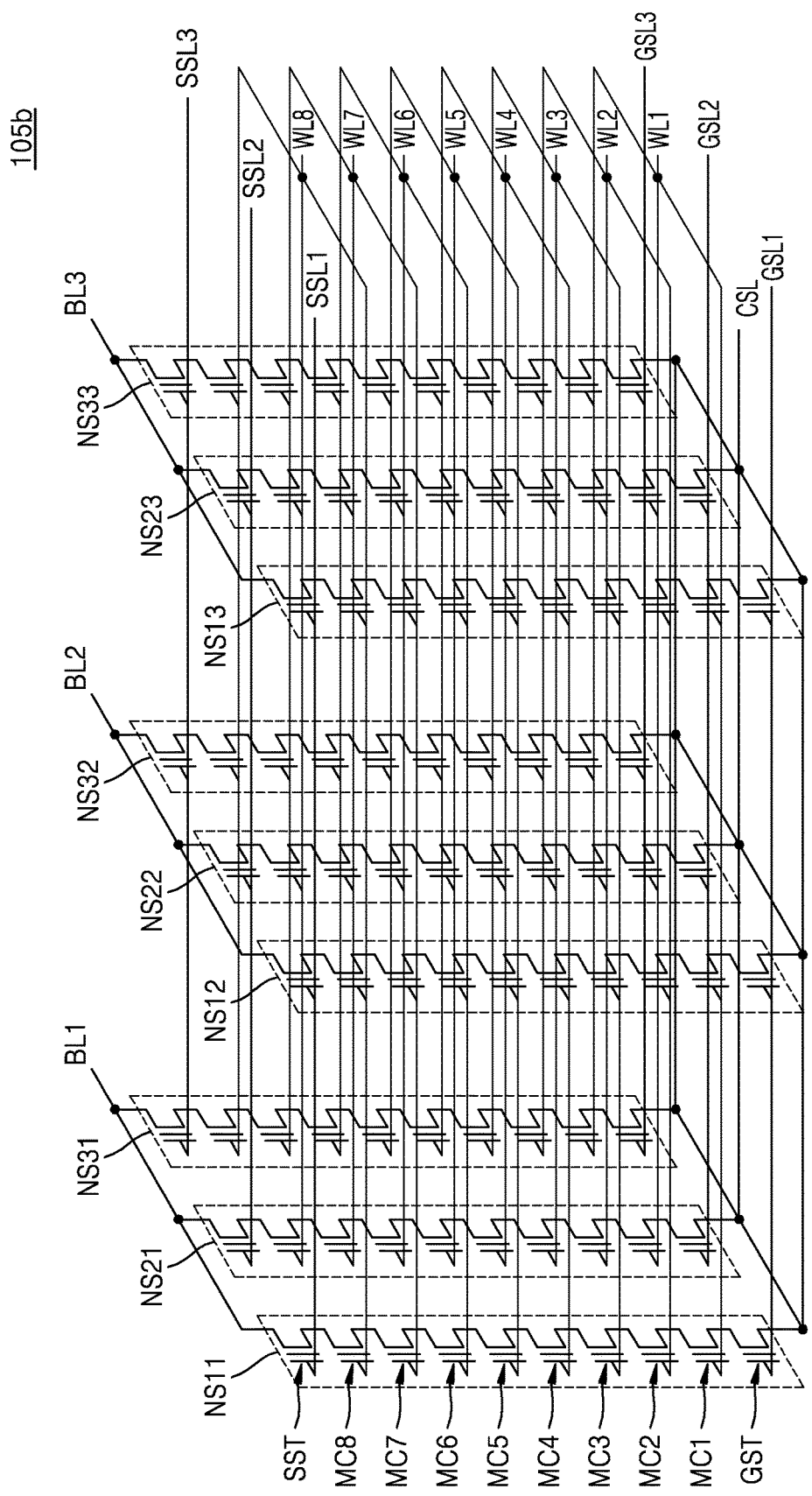
FIG. 5 is a circuit diagram illustrating an example of the memory cell array of FIG. 3.

FIG. 5 is a circuit diagram illustrating a memory cell array 105b which is an example of the memory cell array 105 of FIG. 3.

Referring to FIG. 5, the memory cell array 105b may include a plurality of memory blocks, and each memory block may include a plurality of NAND strings NS11 to NS33, a plurality of word lines WL1 to WL8, a plurality of bit lines BL1 to BL3, a plurality of ground selection lines GSL1 to GSL3, a plurality of string selection lines SSL1 to SSL3, and a common source line CSL. Here, the number of NAND strings, the number of word lines, the number of bit lines, the number of ground selection lines, and the number of string selection lines may be variously changed according to embodiments.

NAND strings NS11, NS21, and NS31 may be provided between a first bit line BL1 and the common source line CSL, NAND strings NS12, NS22, and NS32 may be provided between a second bit line BL2 and the common source line CSL, and NAND strings NS13, NS23, and NS33 may be provided between a third bit line BL3 and the common source line CSL. Each of the NAND strings (e.g., NS11) may include a string selection transistor SST, a plurality of memory cells MC1 to MC8, and a ground selection transistor GST, which are connected in series. Hereinafter, the NAND string will be referred to as a string for convenience.

Strings that are connected in common to one bit line may constitute one column. For example, the strings NS11, NS21, and NS31 commonly connected to the first bit line BL1 may correspond to a first column, and the strings NS12, NS22, and NS32 commonly connected to the second bit line BL2 may correspond to a second column. The strings NS13, NS23, and NS33 commonly connected to the third bit line BL3 may correspond to a third column.

Strings connected to one string selection line may constitute one row. For example, the strings NS11, NS12, and NS13 connected to a first string selection line SSL1 may correspond to a first row, and the strings NS21, NS22, and NS23 connected to a second string selection line SSL2 may correspond to a second row. The strings NS31, NS32, and NS33 connected to a third string selection line SSL3 may correspond to a third row.

The string selection transistor SST may be connected to the string selection lines SSL1 to SSL3. The plurality of memory cells MC1 to MC8 may be respectively connected to the word lines WL1 to WL8. The ground selection transistor GST may be connected to the ground selection line GSL. The string selection transistor SST may be connected to the corresponding bit line BL (BL1 through BL3), and the ground selection transistor GST may be connected to the common source line CSL.

Word lines (e.g., WL1) disposed at the same level may be connected in common, and the string selection lines SSL1 to SSL3 may be separated from one another. The ground selection lines GSL1 to GSL3 may also be separated from one another. For example, when memory cells that are connected to the first word line WL1 and belong to the strings NS11, NS12, and NS13 are programmed, the first word line WL1 and the first string selection line SSL1 may be selected. However, the embodiment is not limited thereto, and according to another embodiment, the ground selection lines GSL1 through GSL3 may be connected in common to one another.

Figure 6:
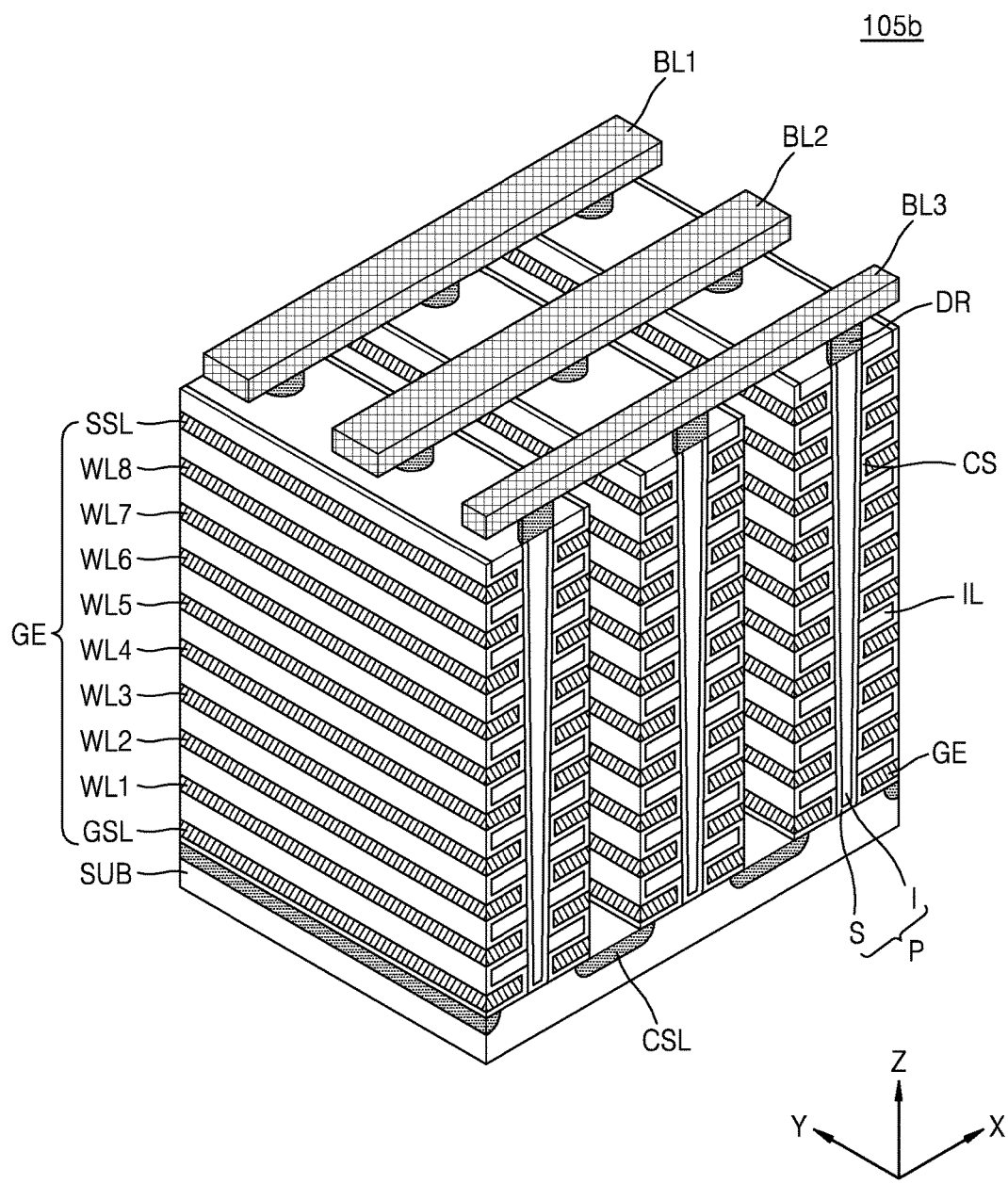
FIG. 6 is a perspective view illustrating an example of the memory cell array of FIG. 5.

FIG. 6 is a perspective view illustrating the memory cell array of 105b FIG. 5.

Referring to FIG. 6, each memory block included in the memory cell array 105b may be formed in a vertical direction to a substrate SUB. Although FIG. 6 illustrates a case in which the memory block includes two selection lines GSL and SSL, eight word lines WL1 to WL8, and three bit lines BL1 to BL3, the memory block is not limited thereto and may include more or fewer lines.

The substrate SUB may have a first conductivity type (e.g., p type) and extend in a first direction (e.g., Y direction) on the substrate SUB, and a common source line CSL doped with impurities of a second conductivity type (e.g., n type) may be provided. A plurality of insulating layers IL may be provided on a region of the substrate SUB between two adjacent common source lines CSL. The plurality of insulating layers IL may extend in the first direction and be sequentially disposed in a third direction (e.g., Z direction). The plurality of insulating layers IL may be spaced apart from one another by a predetermined distance in the third direction. For example, the plurality of insulating layers IL may include an insulating material such as silicon oxide.

A plurality of pillars P may be provided on a region of the substrate SUB between two adjacent common source lines CSL. The plurality of pillars P may be sequentially disposed in the third direction and penetrate the plurality of insulating layers IL in the third direction. For example, the plurality of pillars P may penetrate the plurality of insulating layers IL and contact the substrate SUB. In detail, a surface layer S of each of the pillars P may include a silicon material of a first type and function as a channel region. Meanwhile, an internal layer I of each of the pillars P may include an insulating material such as silicon oxide, or an air gap.

A charge storage layer CS may be provided on a region between two adjacent common source lines CSL along exposed surfaces of the insulating layers IL, the pillars P, and the substrate SUB. The charge storage layer CS may include a gate insulation layer (or referred to as 'tunnel insulation layer'), a charge trap layer, and a blocking insulation layer. For example, the charge storage layer CS may have an oxide-nitride-oxide (ONO) structure. Also, a gate electrode GE such as the selection lines GSL and SSL and the word lines WL1 through WL8 may be provided on an exposed surface of the charge storage layer CS in the region between the two adjacent common source lines CSL.

Drains or drain contacts DR may be respectively provided on the plurality of pillars P. For example, the drains or drain contacts DR may include a silicon material doped with impurities having a second conductivity type. The bit lines BL1 through BL3 may be provided on the drains DR. The bit lines BL1 through BL3 may extend in a second direction (e.g., X direction) and be spaced apart from one another by a predetermined distance in the first direction.

Figure 7:
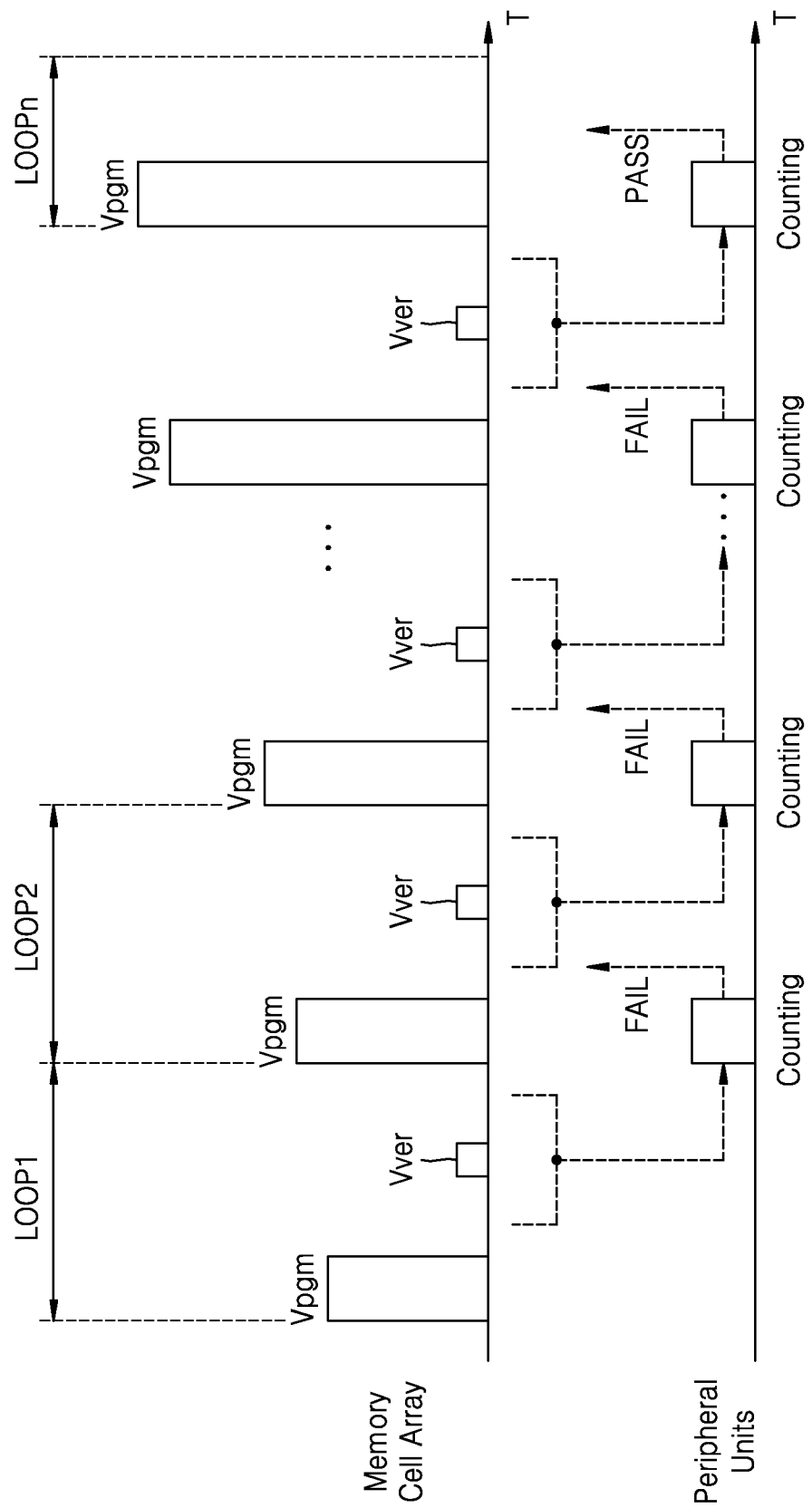
FIG. 7 is a timing diagram illustrating an example of a programming method of a memory device according to an embodiment of the disclosure.

FIG. 7 is a timing diagram illustrating an example of a programming method of a memory device according to an embodiment of the disclosure.

Referring to FIGS. 2 and 7, a program voltage Vpgm is applied to selected memory cells in the memory cell array 105 in a first program loop LOOP1, and then, a program verify voltage Vver may be applied. In a second program loop LOOP2, a program voltage Vpgm may be applied to the selected memory cells in the memory cell array 105, and then a program verify voltage Vver may be applied. A program voltage Vpgm is applied to the selected memory cells in the memory cell array 105 in an nth program loop LOOPn, and a programming operation may be ended (where n is an integer equal to or greater than 2).

While the program voltage Vpgm is applied in the second program loop LOOP2, peripheral circuits in the memory device 100, for example, the page buffer decoding unit 140, the analog bit counting unit 160, and the digital adding unit 170 may perform a counting operation based on a verify read result stored in the page buffer group 120. The counting operation may be an operation of counting slow bits or fail bits having a threshold voltage lower than a program verify voltage Vver. Hereinafter, a counting operation will be referred to as a slow bit counting operation, and fail bits will be referred to as slow bits.

According to the present embodiment, while a slow bit counting operation is performed based on the verify read result according to the program verify voltage Vver, a program voltage Vpgm may be applied to the memory cell array 105. The slow bit counting operation may be performed while the program voltage Vpgm is being applied. Thus, no time is additionally required to count slow bits, and the entire programming performing period is not increased.

When the number of slow bits is greater than a bypass value, the pass/fail checking unit 180 determines a program fail and outputs a fail signal FAIL. When a fail signal FAIL is output, a program verify voltage Vver may be applied to the memory cell array 105 again in a third program loop. When the number of slow bits is equal to or less than the bypass value, the pass/fail checking unit 180 determines a program pass and outputs a pass signal PASS. When the pass signal PASS is output, a program verify voltage Vver is not applied in an nth program loop, but a program operation may be ended. As described above, when the number of slow bits is less than a bypass value, a program pass is determined, and thus, delay of a programming period due to slow cells may be prevented.

According to the present embodiment, a slow bit counting operation may be performed at the same time with application of a program voltage Vpgm. Thus, after a counting result is determined as a program pass, a program voltage Vpgm may be applied one more time. As described above, when a program voltage Vpgm is applied one more time, the number of program-failed cells may be further reduced.

Figure 8:
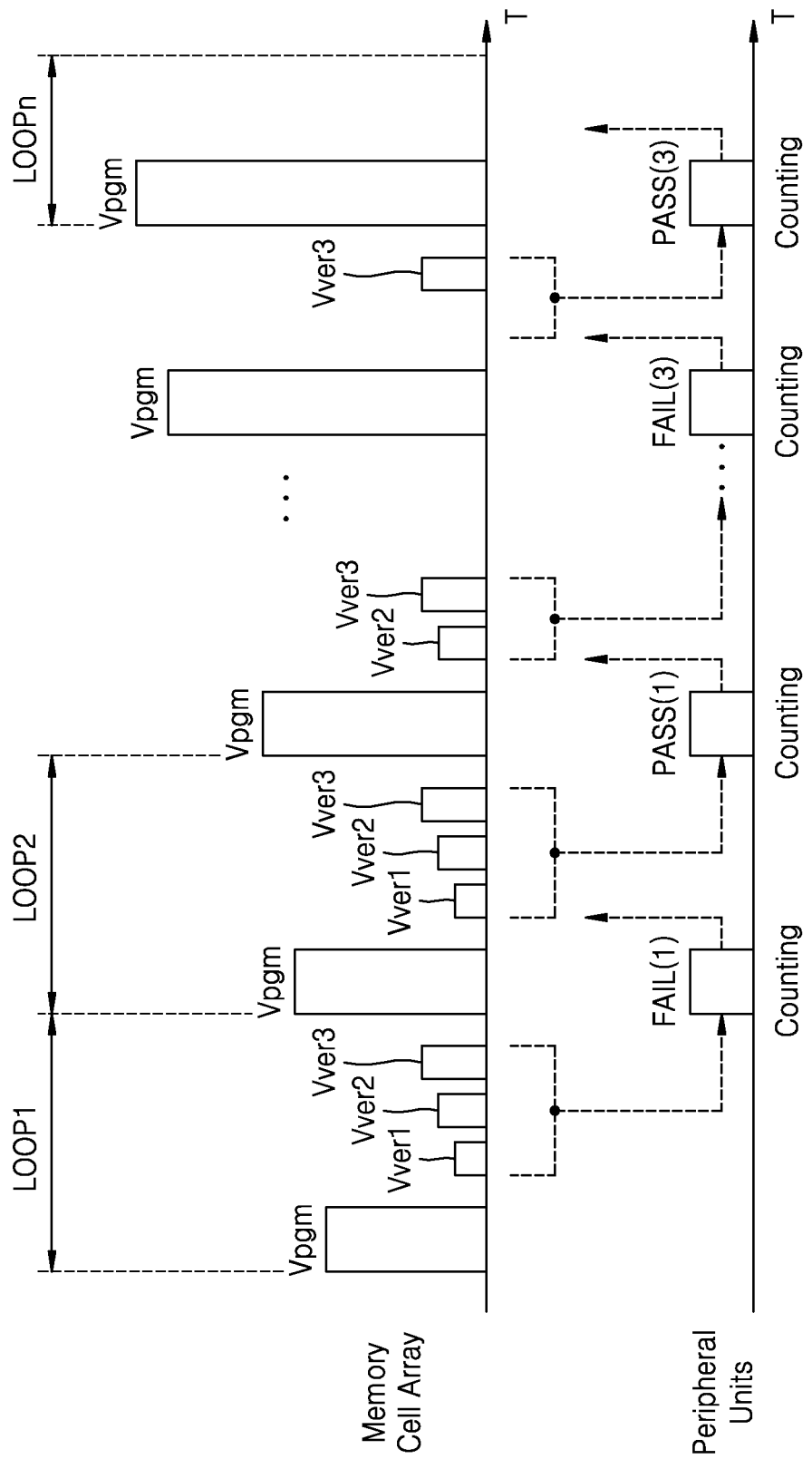
FIG. 8 is a timing diagram illustrating an example of a programming method of a memory device according to an embodiment of the disclosure.

FIG. 8 is a timing diagram illustrating an example of a program method of a memory device according to an embodiment of the disclosure.

Referring to FIGS. 2 and 8, the memory device 100 may include multi-level cells, and the multi-level cells may be programmed to one of first through third program states. The first through third program states may be classified according to a threshold voltage. Memory cells programmed in the first program state may be verified by using a first verify voltage Vver1, memory cells programmed in the second program state may be verified by using a second verify voltage Vver2, and memory cells programmed in the third program state may be verified by using a third verify voltage Vver3. The number of simultaneously programmed program states is not limited. When k program states are simultaneously programmed, programming and verification may be performed by using k verify voltages.

First, counting may be performed on a verify read result of a lowest verify voltage, for example, the first verify voltage Vver1, from among verify read results according to a plurality of verify voltages, the first through third verify voltages Vver1 through Vver3. The number of fail bits of memory cells programmed in a first program state may be compared with a bypass value based on the verify read result of the first verify voltage Vver1, and a pass or a fail of the first program state may be determined based on a result of the comparison.

When the verify read result of the first verify voltage Vver1 is determined as a program pass, the first verify voltage Vver1 may not be applied any more. Subsequently, counting may be performed on a verify read result of a lowest verify voltage, that is, the second verify voltage Vver2. The number of fail bits of memory cells programmed in the second program state may be compared based on the verify read result of the second verify voltage Vver2, and a pass or a fail of the second program state may be determined based on a result of the comparison.

When the verify read result of the second verify voltage Vver2 is determined as a program pass, the second verify voltage Vver2 may not be applied any more. Subsequently, counting may be performed on a verify read result of a lowest verify voltage, that is, the third verify voltage Vver3. The number of fail bits of memory cells programmed in the third program state may be compared based on the verify read result of the third verify voltage Vver3, and a pass or a fail of the third program state may be determined based on a result of the comparison.

When the verify read result of the third verify voltage Vver3 is determined as a program pass, the third verify voltage Vver3 may not be applied any more. Subsequently, counting may be performed on a verify read result of a lowest verify voltage. When no verify voltage is applied any more, that is, when all memory cells are program-passed, programming may be ended.

Figure 9:
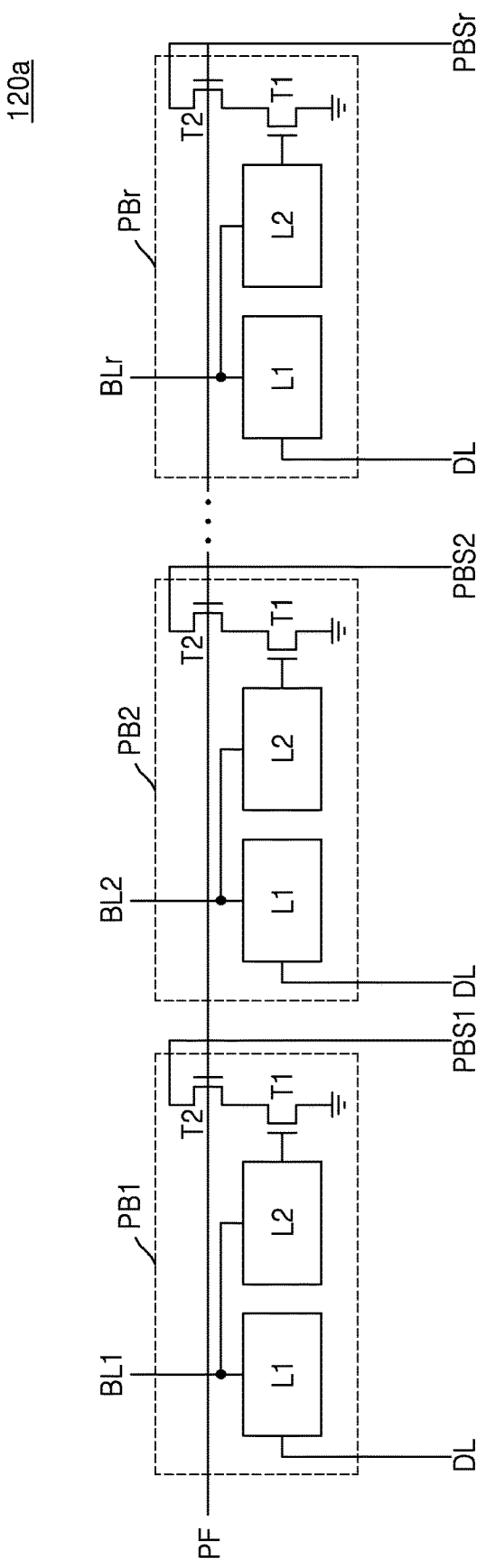
FIG. 9 is a circuit diagram of a page buffer group according to an embodiment of the disclosure.

FIG. 9 is a circuit diagram illustrating a page buffer group 120a according to an embodiment of the disclosure.

Referring to FIG. 9, the page buffer group 120a may include a plurality of page buffers PB1 through PBr, and the plurality of page buffers PB1 through PBr may respectively output a plurality of page buffer signals PBS1 through PBSr. The page buffer group 120a according to the present embodiment may be an example of the page buffer group 120 of FIG. 2.

Each of the page buffers PB1 through PBr may include a first latch L1, a second latch L2, a first transistor T1, and a second transistor T2. The first and second latches L1 and L2 may be connected to respectively corresponding bit lines BL1 through BLr. For example, first and second latches L1 and L2 of a first page buffer PB1 may be connected to a first bit line BL1. First and second latches L1 and L2 of an rth page buffer PBr may be connected to an rth bit line BLr.

The first latch L1 may be a data latch storing data to be programmed, a read result, and a verify read result. The first latch L1 may be connected to a data line DL. The second latch L2 may store a verify read result stored in the first latch L1, and may operate independently of the first latch L1. The second latch L2 may invert a value stored therein and transmit the inverted value to a gate of a first transistor T1.

The first transistor T1 may operate in response to the value stored in the second latch L2. A ground voltage VSS may be supplied to a first end of the first transistor T1, and a second end of the first transistor T1 is connected to a second transistor T2. The second transistor T2 may operate in response to a transmission signal PF. A first end of the second transistor T2 may be connected to the first transistor T1, and corresponding page buffer signals PBS1 through PBSr may be output through a second end of the second transistor T2.

When a verify read operation is performed, a verify read result may be stored in the page buffers PB1 through PBr. According to the verify read result, the page buffers PB1 through PBr may respectively output first through rth page buffer signals PBS1 through PBSr. In detail, when a transmission signal PF is activated, the second transistor T2 may be turned on to respectively output the first through rth page buffer signals PBS1 through PBSr.

According to an embodiment, a bit line connected to a program-failed memory cell may be logic low, and a bit line connected to a program-passed memory cell may be logic high. Logic values of the bit lines BL1 through BLr are stored in the page buffers PB1 through PBr. The second latch L2 of the first page buffer PB1 outputs an inverted value of the stored value to the gate of the first transistor T1. When a memory cell corresponding to the first page buffer PB1 is program-failed, the second latch L2 may output a logic high level to a gate of the first transistor T1, and the first transistor T1 may be turned on. When a memory cell corresponding to the first page buffer PB1 is a program-passed, the second latch L2 may output a logic low level to the gate of the first transistor T1, and the first transistor T1 may be turned off.

When the first page buffer PB1 corresponds to a program-failed memory cell, and the transmission signal PF is activated, the first page buffer signal PBS1 is a ground level VSS. When the first page buffer PB1 corresponds to a program-passed memory cell, and the transmission signal PF is activated, the first page buffer signal PBS1 is floated. As described above, when the transmission signal PF is activated, the first page buffer PB1 may output a ground voltage VSS or float the first page buffer signal PBS1 according to whether a memory cell is program-passed or program-failed. The other page buffers PB2 through PBr may operate in the same manner as the first page buffer PB1.

Figure 10:
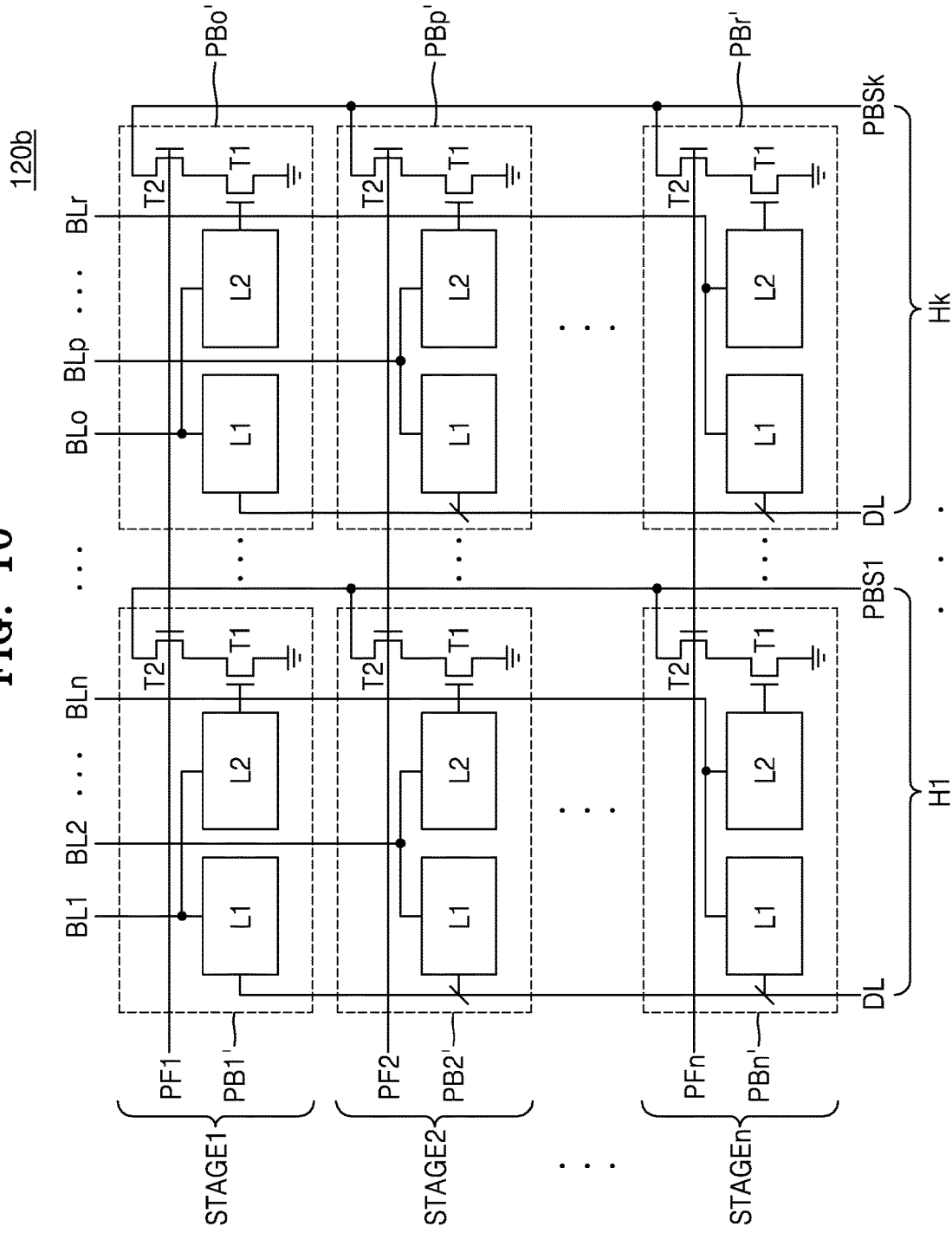
FIG. 10 is a circuit diagram of a page buffer group according to an embodiment of the disclosure.

FIG. 10 is a circuit diagram of a page buffer group according to an embodiment of the disclosure.

Referring to FIG. 10, a page buffer group 120b may include a plurality of page buffers PB1' through PBr', and the plurality of page buffers may constitute a plurality of multi-stage structures H1 through Hk. The page buffer group 120b according to the present embodiment may be a modified example of the page buffer group 120a of FIG. 9. The page buffers PB1' through PBr' according to the present embodiment may be substantially similarly implemented as the page buffers PB1 through PBr illustrated in FIG. 9, and details described with reference to FIG. 9 may also apply to the present embodiment. Hereinafter, the description will focus on a difference of the page buffers PB1' through PBr' from the page buffers PB1 through PBr illustrated in FIG. 9.

The first through nth page buffers PB1' through PBn' may constitute a first multi-stage structure H1, and oth through rth page buffers PBo' through PBr' may constitute a kth multi-stage structure Hk. The number of page buffers provided in each multi-stage structure may be identical. In each multi-stage structure, page buffers may be connected to one another. For example, in the first multi-stage structure H1, the page buffers PB1' through PBn' may be connected in a Wired-OR structure to output a first page buffer signal PBS1. In the kth multi-stage structure H2, the page buffers PBo' through PBr' may be connected in a Wired-OR structure to output a kth page buffer signal PBSk. Bit lines BL1 through BLr may be respectively connected to page buffers PB1' through PBr'. And each page buffer of the same multi-stage structure may be connected to the same data line DL. For example, page buffers PB1' through PBn' of multi-stage structure H1 may be connected to the same data line DL, and page buffers PBo' through PBr' of multi-stage structure Hk may be connected to the same data line DL.

Each of the page buffers PB1' through PBn' may include a first latch L1, a second latch L2, a first transistor T1, and a second transistor T2. The second transistors T2 may operate in response to corresponding transmission signals PF1 through PFn. When a first transmission signal PF1 is activated, page buffers PB1' through PBo' of a first stage STAGE1 may output first through kth page buffer signals PBS1 through PBSk. When a second transmission signal PF2 is activated, page buffers PB2' through PBp' of a second stage STAGE2 may output first through kth page buffer signals PBS1 through PBSk. When an nth transmission signal PFn is activated, page buffers PBn' through PBr' of an nth stage STAGEn may output first through kth page buffer signals PBS1 through PBSk. In some embodiments, the first through nth transmission signals PF1 through PFn may be sequentially activated. In some embodiments, at least two of the first through nth transmission signals PF1 through PFn may be simultaneously activated.

Figure 11:
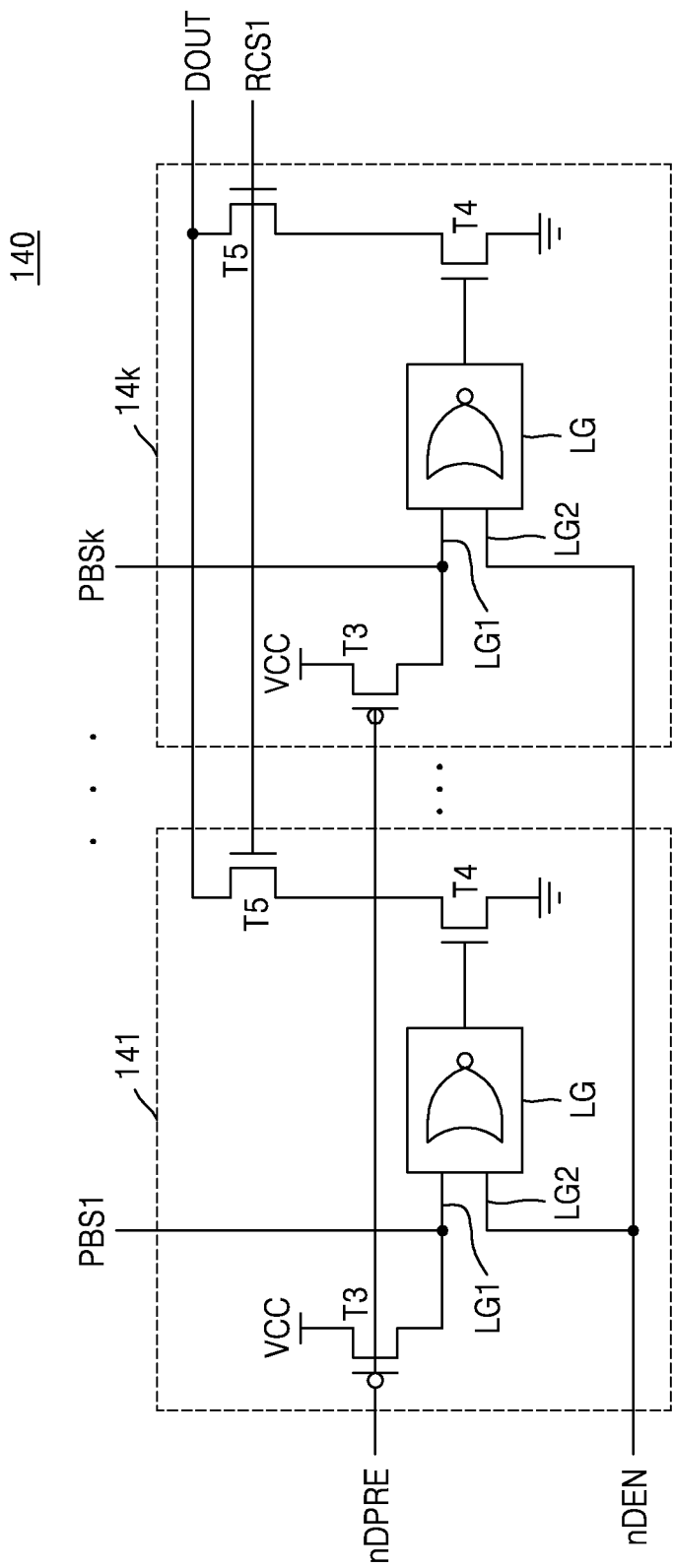
FIG. 11 is a circuit diagram illustrating a page buffer decoding unit according to an embodiment of the disclosure.

FIG. 11 is a circuit diagram illustrating the page buffer decoding unit 140 according to an embodiment of the disclosure.

Referring to FIGS. 3 and 9 through 11, the page buffer decoding unit 140 may include first through kth page buffer decoders 141 through 14k, and the first through kth page buffer decoders 141 through 14k may respectively receive first through kth page buffer signals PBS1 through PBSk from the page buffer group 120a or 120b. The page buffer decoding unit 140 may output a decoder output signal DOUT in response to the first through kth page buffer signals PBS1 through PBSk. A decoder enable signal nDEN and a decoder precharge signal nDPRE may be generated in the controller 190, and may be provided commonly to the first through kth page buffer decoders 141 through 14k.

Each of the page buffer decoders 141 through 14k may include a third transistor T3, a fourth transistor T4, a fifth transistor T5, and a logic gate LG. A first input LG1 of the logic gate LG may be connected to the third transistor T3, and corresponding page buffer signals PBS1 through PBSk are supplied to the first input LG1. The third transistor T3 may respond to the decoder precharge signal nDPRE to precharge the first input LG1 of the logic gate LG to a power voltage VCC. The decoder enable signal nDEN is supplied to the second input LG2 of the logic gate LG.

The fourth transistor T4 operates in response to an output of the logic gate LG. A ground voltage VSS is supplied to a first end of the fourth transistor T4, and a second end of the fourth transistor T4 is connected to the fifth transistor T5. The fifth transistor T5 may operate in response to a first reference current signal RCS1. A first end of the fifth transistor T5 may be connected to the fourth transistor T4, and a decoder output signal DOUT may be output through a second end of the fifth transistor T5.

According to an embodiment, the logic gate LG may be an element performing a NOR operation. The logic gate LG may output a logic high level when the first and second inputs LG1 and LG2 are logic low, and output a logic low level when at least one of the first and second inputs LG1 and LG2 is logic high. When the decoder enable signal nDEN is logic high, the logic gate LG may output a logic low level, and the page buffer decoding unit 140 may be inactivated. When the decoder enable signal nDEN is logic low, the logic gate LG may output a logic high or logic low level according to the first input LG1, and the page buffer decoding unit 140 may be activated.

When all of the transmission signals PF1 through PFn are inactivated, the first through kth page buffer signals PBS1 through PBSk are all in a floated state. The third transistor T3 may respond to the decoder precharge signal nDPRE to precharge the first input LG1 to a power voltage VCC. When the decoder precharge signal nDPRE is inactivated, the first input LG1 of the logic gate LG may be floated.

When one of the transmission signals PF1 through PFn is activated, one of a first stage STAGE1 through an nth stage STAGEn of the page buffers PB1 through PBr may output first through kth page buffer signals PBS1 through PBSk. Hereinafter, an operation of the first page buffer decoder 141 according to a program pass/fail of a memory cell corresponding to the first page buffer signal PBS1 will be described.

When a memory cell corresponding to the first page buffer signal PBS1 is a program pass, the first page buffer signal PBS1 may be in a floated state. Accordingly, the first input LG1 of the logic gate LG of the first page buffer decoder 141 may maintain a power voltage VCC, that is, logic high, and the logic gate LG may output a logic low level. Accordingly, as the fourth transistor T4 is turned off, output of the first page buffer decoder 141 may be floated.

When a memory cell corresponding to the first page buffer signal PBS1 is a program fail, the first page buffer signal PBS1 may be a ground voltage VSS. Accordingly, a voltage of the first input LG1 of the logic gate LG of the first page buffer decoder 141 may be transitioned to a ground voltage VSS, that is, to a logic low level, and the logic gate LG may output a logic high level. Accordingly, as the fourth transistor T4 is turned on, the first page buffer decoder 141 operates as a current sink that leaks a current from an output node.

According to the present embodiment, an amount of current leaking through the first page buffer decoder 141 may be controlled according to a first reference current signal RCS1. A current leaking through the first page buffer decoder 141 in response to the first reference current signal RCS1 may be a first reference current RC1. The other page buffer decoders 14k may operate substantially in the same manner as the first page buffer decoder 141, and thus, description thereof will be omitted. Output signals of the page buffer decoders 141 through 14k according to a verify read result are listed as shown in Table 1 below.

TABLE 1

|  | PROGRAM PASS | PROGRAM FAIL |
| --- | --- | --- |
| BIT LINE | HIGH | LOW |
| PAGE BUFFER SIGNAL | FLOAT | VSS |
| DECODER OUTPUT SIGNAL | FLOAT | CURRENT SINK RC1 |

Output nodes of the first through kth page buffer decoders 141 through 14k may be connected in common to an output node of the page buffer decoding unit 140. Accordingly, a decoder output signal DOUT may be a total sum of currents leaked through the first through kth page buffer decoders 141 through 14k. For example, a current leaking in response to the first reference current signal RCS1 from each of the first through kth decoders 141 through 14k is the first reference current RC1. The number of decoders that are activated among the first through kth page buffer decoders 141 through 14k may be determined based on the number of fail bits indicated by the page buffer signals PBS1 through PBSk. Accordingly, the decoder output signal DOUT of the page buffer decoding unit 140 may be several times the first reference current RC1. The page buffer decoding unit 140 may be a current sink leaking an amount of current corresponding to the number of program-failed memory cells.

Figure 12:
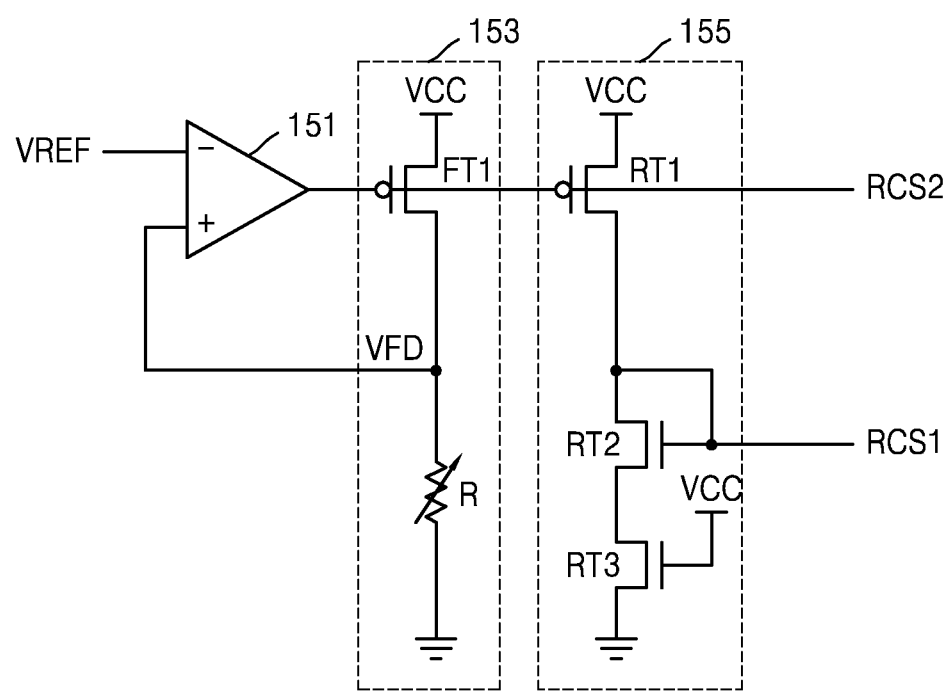
FIG. 12 is a circuit diagram illustrating a reference current generating unit according to an embodiment of the disclosure.

FIG. 12 is a circuit diagram illustrating the reference current generating unit 150 according to an embodiment of the disclosure.

Referring to FIGS. 3, 11 and 12, the reference current generating unit 150 may include a differential amplifier 151, a feedback variable resistor unit 153, and a first reference current signal output unit 155. The first reference current signal output unit 155 may include first through third reference transistors RT1, RT2, and RT3, and the feedback variable resistor unit 153 may include a first feedback transistor FT1 and a resistor R.

A reference voltage VREF may be input to a first input terminal of the differential amplifier 151, and a feedback voltage VFD may be input to a second input terminal of the differential amplifier 151. The feedback voltage VFD may be a voltage across the resistor R. An output terminal of the differential amplifier 151 may be connected to each gate of the first reference transistor RT1 and the first feedback transistor FT1, and a second reference current signal RCS2 may be output through the output terminal of the differential amplifier 151. The output second reference current signal RCS2 may be provided to the analog bit counting unit 160. The analog bit counting unit 160 may generate a second reference current in response to the second reference current signal RCS2.

The first feedback transistor FT1 may operate in response to an output signal of the differential amplifier 151. A power voltage VCC is supplied to a first end of the first feedback transistor FT1, and a second input terminal of the differential amplifier 151 is connected to a second end of the first feedback transistor FT1. The first feedback transistor FT1 may operate as a current driver that allows a first current Ia to flow in response to the output signal of the differential amplifier 151. The first current Ia may be determined according to a reference voltage VREF and the resistor R (that is, Ia=VREF/R).

The first reference transistor RT1 may operate in response to the output signal of the differential amplifier 151. A power voltage VCC may be supplied to a first end of the first reference transistor RT1, and a second reference transistor RT2 is connected to a second end of the first reference transistor RT1. The first reference transistor RT1 may operate as a current driver that allows a second current Ib to flow in response to the output signal of the differential amplifier 151.

The second reference transistor RT2 may be a diode-connected transistor, and a node voltage between the first reference transistor RT1 and the second reference transistor RT2 may be output as a first reference current signal RCS1. The output first reference current signal RCS1 may be provided to the page buffer decoding unit 140. The page buffer decoding unit 140 may generate a first reference current in response to the first reference current signal RCS1.

According to the present embodiment, a size of the first feedback transistor FT1 and a size of the first reference transistor RT1 may be different from each other. In an embodiment, a width of the first feedback transistor FT1 may be M times a width of the first reference transistor RT1, and M is a positive integer. According to an embodiment, the first feedback transistor FT1 may include M reference transistors connected in parallel, and the first reference transistor RT1 may include one reference transistor. According to an embodiment, the first feedback transistor FT1 may include M*N reference transistors connected in parallel with one another, and the first reference transistor RT1 may include N reference transistors that are connected in parallel with one another, and M and N are positive integers.

Accordingly, a first reference current generated according to the first reference current signal RCS1 may be different from a second reference current generated according to the second reference current signal RCS2. In an embodiment, the first reference current may be 1/M of the second reference current. Accordingly, a decoder output signal DOUT output from the page buffer decoding unit 140 may be the number of fail bits multiplied by the first reference current, and the decoder output signal DOUT may correspond to the number of fail bits multiplied by 1/M*the second reference current.

Figure 13:
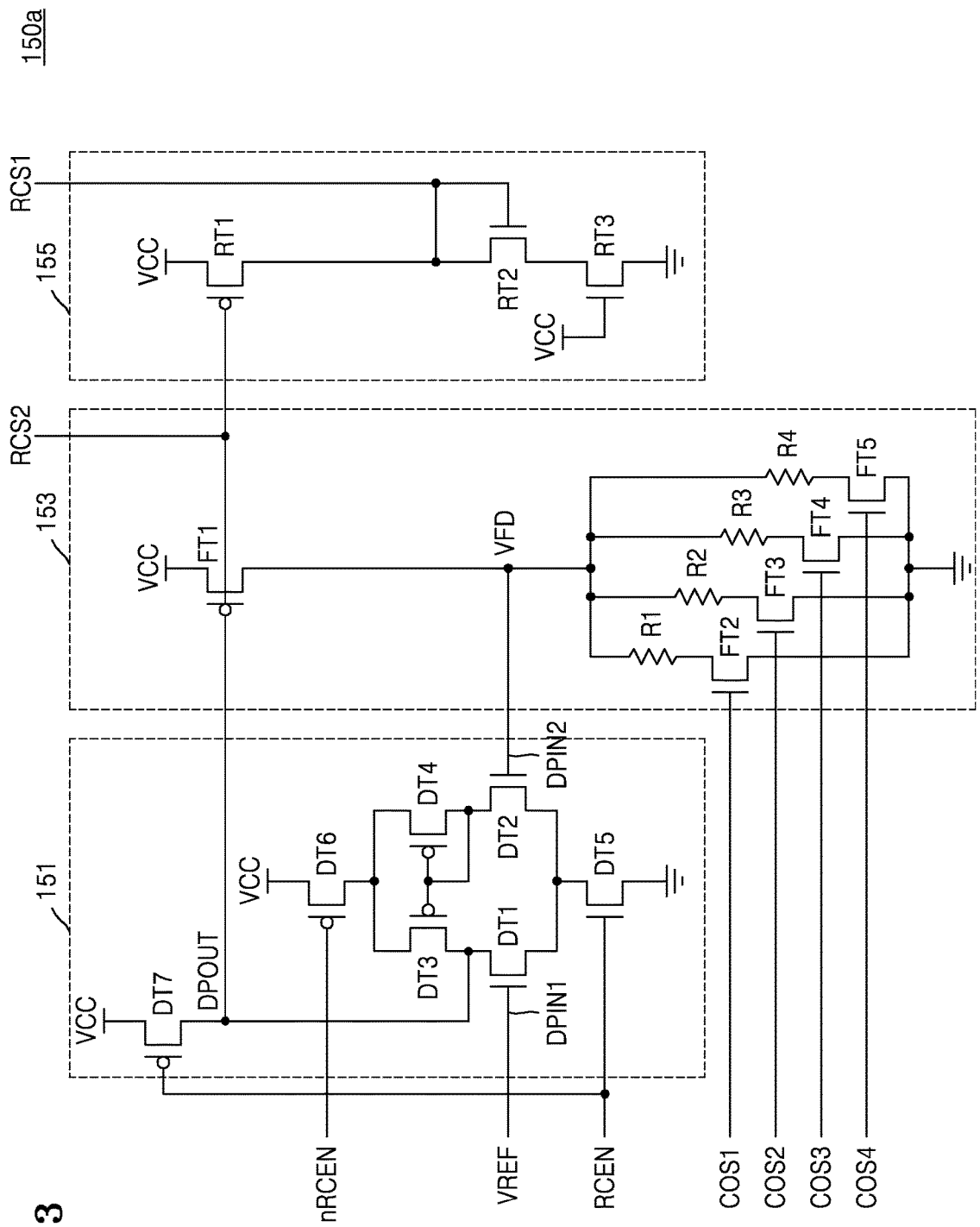
FIG. 13 is a detailed circuit diagram of a reference current generating unit according to an embodiment of the disclosure.

FIG. 13 is a detailed circuit diagram of the reference current generating unit 150a according to an embodiment of the disclosure.

Referring to FIGS. 3, 11, and 13, the reference current generating unit 150a may include a differential amplifier 151, a feedback variable resistor unit 153, and a first reference current signal output unit 155, and the reference current generating unit 150a may be a specific embodiment of the reference current generating unit 150 illustrated in FIG. 12.

The differential amplifier 151 may include first through seventh differential amplifier transistors DT1 through DT7. The first and second differential amplifier transistors DT1 and DT2 may constitute first and second inputs DPIN1 and DPIN2 of the differential amplifier 151. A reference voltage VREF may be supplied to the first input DPIN1 of the differential amplifier 151, and a feedback voltage VFD distributed by the feedback variable resistor unit 153 may be supplied to the second input DPIN2 of the differential amplifier 151. For example, the reference voltage VREF may be a power voltage VCC or one of various voltages used in the non-volatile memory device 100.

The third and fourth differential amplifier transistors DT3 and DT4 may constitute a current mirror. The fifth differential amplifier transistor DT5 may supply a ground voltage VSS to the differential amplifier 151 in response to a reference current enable signal RCEN. The sixth differential amplifier transistor DT6 may supply a power voltage VCC to the differential amplifier 151 in response to a reference current enable inverse signal nRCEN. That is, when the reference current enable signal RCEN is logic low, and the reference current enable inverse signal nRCEN is logic high, the differential amplifier 151 is inactivated. The seventh differential amplifier transistor DT7 may supply a power voltage VCC to an output node DPOUT of the differential amplifier 151 in response to the reference current enable signal RCEN. When the differential amplifier 151 is inactivated, the seventh differential amplifier transistor DT7 outputs a power voltage VCC to the output node DPOUT of the differential amplifier 151.

The feedback variable resistor unit 153 may include first through fifth feedback transistors FT1 through FT5 and first through fourth resistors R1 through R4. However, the disclosure is not limited thereto, and according to embodiments, the number of feedback transistors or the number of resistors included in the feedback variable resistor unit 153 may be various.

First ends of the first through fourth resistors R1 through R4 may be connected in common to the second input DPIN2 of the differential amplifier 151, and second ends thereof may be respectively connected to the second through fifth feedback transistors FT2 through FT5. First ends of the second through fifth feedback transistors FT2 through FT5 may be connected to the first through fourth resistors R1 through R4, and a ground voltage VSS may be supplied to second ends of the second through fifth feedback transistors FT2 through FT5. The second through fifth feedback transistors FT2 through FT5 may operate in response to first through fourth current option signals COS1 through COS4. For example, the first through fourth current option signals COS1 through COS4 may be provided by the controller 190.

The first through fourth resistors R1 through R4 and the second through fifth feedback transistors FT2 through FT5 may constitute a variable resistor R (see FIG. 12) that operates in response to the first through fourth current option signals COS1 through COS4. A voltage supplied to the second input DPIN2 of the differential amplifier 151 may be varied. Accordingly, according to the first through fourth current option signals COS1 through COS4, an output signal of the differential amplifier 151 may be varied.

The first reference current signal output unit 155 may include first through third reference transistors RT1 through RT3. The first reference transistor RT1 may operate in response to an output signal of the differential amplifier 151, a power voltage VCC may be supplied to a first end of the first reference transistor RT1, and the second reference transistor RT2 may be connected to a second end of the first reference transistor RT1. The first reference transistor RT1 may be connected to a first end of the second reference transistor RT2, a third reference transistor RT3 may be connected to a second end of the second reference transistor RT2, and the second reference transistor RT2 may be diode-connected to output a first reference current signal RCS1. The second reference transistor RT2 may be connected to a first end of the third reference transistor RT3, a ground voltage VSS may be supplied to a second end of the third reference transistor RT3, a power voltage VCC may be supplied to a gate of the third reference transistor RT3, and the third reference transistor RT3 may be always in a turned-on state.

When the reference current enable signal RCEN is activated, an output of the differential amplifier 151 may be determined by the differential amplifier 151 and the feedback variable resistor unit 153. The output of the differential amplifier 151 may be adjusted by using the first through fourth current option signals COS1 through COS4. The first reference current signal output unit 155 outputs a first reference current signal RCS1 in response to the output of the differential amplifier 151. Accordingly, the first reference current signal RCS1 may be adjusted by using the first through fourth current option signals COS1 through COS4.

When the reference current enable signal RCEN is inactivated, an output of the differential amplifier 151 may be determined regardless of the feedback variable resistor unit 153. Accordingly, even when the first through fourth current option signals COS1 through COS4 are adjusted, the first reference current signal output unit 155 may maintain the first reference current signal RCS1 uniformly.

Figure 14:
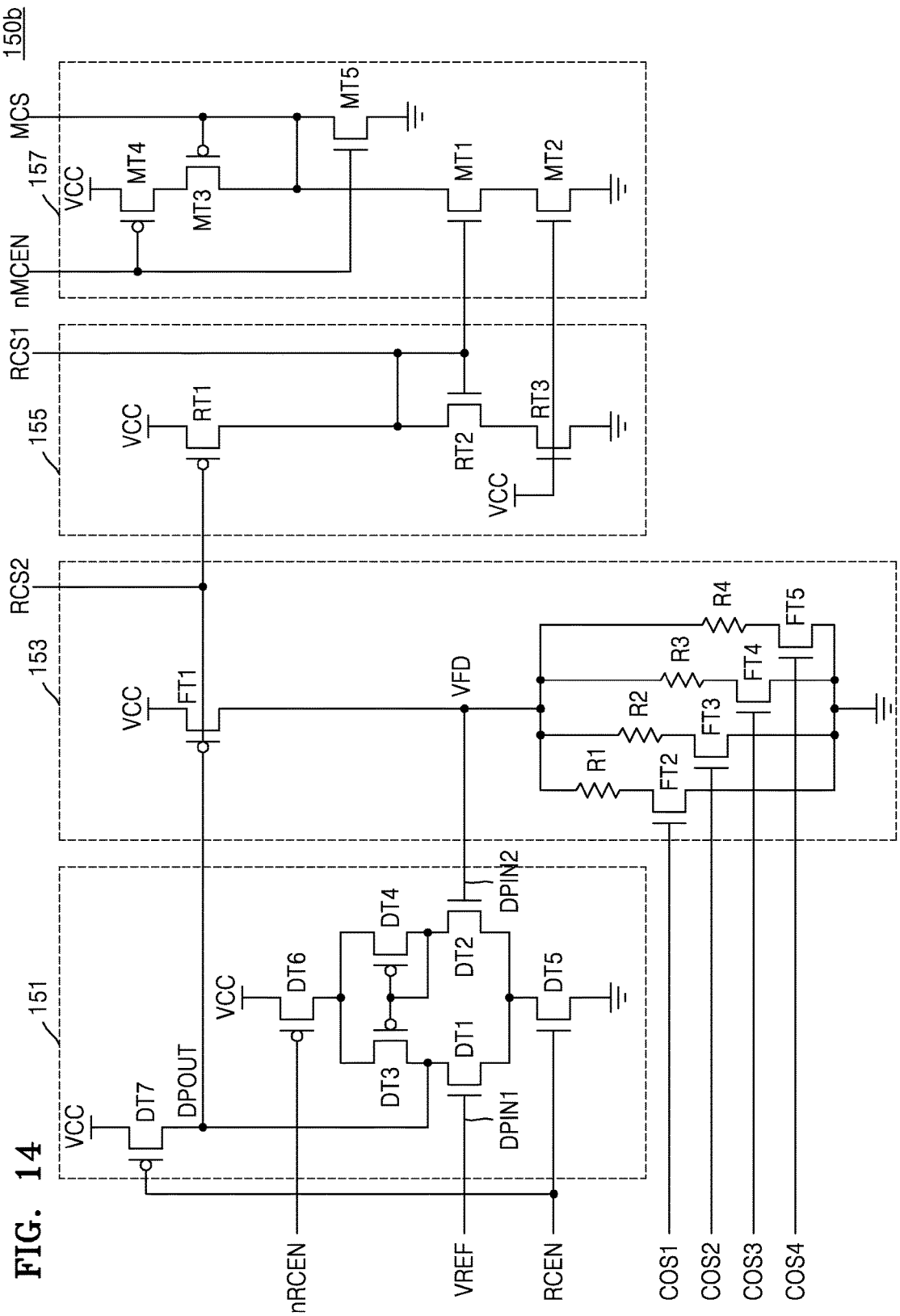
FIG. 14 is a detailed circuit diagram of a reference current generating unit according to an embodiment of the disclosure.

FIG. 14 is a detailed circuit diagram of the reference current generating unit 150b according to an embodiment of the disclosure.

Referring to FIG. 14, the reference current generating unit 150b is a modified embodiment of the reference current generating unit 150a illustrated in FIG. 13, and may further include a maximum current signal output unit 157 compared to the reference current generating unit 150a of FIG. 13. The maximum current signal output unit 157 may include first through fifth maximum current transistors MT1 through MT5. The first maximum current transistor MT1 may operate as a current mirror with the second reference transistor RT2. The second maximum current transistor MT2 may be connected between the first maximum current transistor MT1 and a ground voltage node. A power voltage VCC is supplied to a gate of the second maximum current transistor MT2 so that the second maximum current transistor MT2 is always turned on.

The first maximum current transistor MT1 is connected to a first end of the third maximum current transistor MT3, and the fourth maximum current MT4 is connected to a second end of the third maximum current transistor MT3. The fourth maximum current transistor MT4 may be connected between the third maximum current transistor MT3 and a power voltage node. The fourth maximum current transistor MT4 may supply a power voltage VCC to the maximum current signal output unit 157 in response to a maximum current enable signal nMCEN. The third maximum current transistor MT3 may be connected to a first end of the fifth maximum current transistor MT5, and a ground voltage VSS may be supplied to a second end of the fifth maximum current transistor MT5. The fifth maximum current transistor MT5 may supply a ground voltage VSS to the maximum current signal output unit 157 in response to the maximum current enable signal nMCEN. A first end of the first maximum current transistor MT1, the first end and a gate of the third maximum current transistor MT3, and the first end of the fifth maximum current transistor MT5 may be connected to each other, and a maximum current signal MCS may be output therefrom.

When the maximum current enable signal nMCEN is activated, the fourth maximum current transistor MT4 may be turned on, and the fifth maximum current transistor MT5 may be turned off. The maximum current signal output unit 157 may output a maximum current signal MCS in response to a first reference current signal RCS1. When the maximum current enable signal nMCEN is inactivated, the fourth maximum current transistor MT4 may be turned off, and the fifth maximum current transistor MT5 may be turned on. The maximum current signal output unit 157 may output a ground voltage VSS as a maximum current signal MCS regardless of the first reference current signal RCS1.

Figure 15:
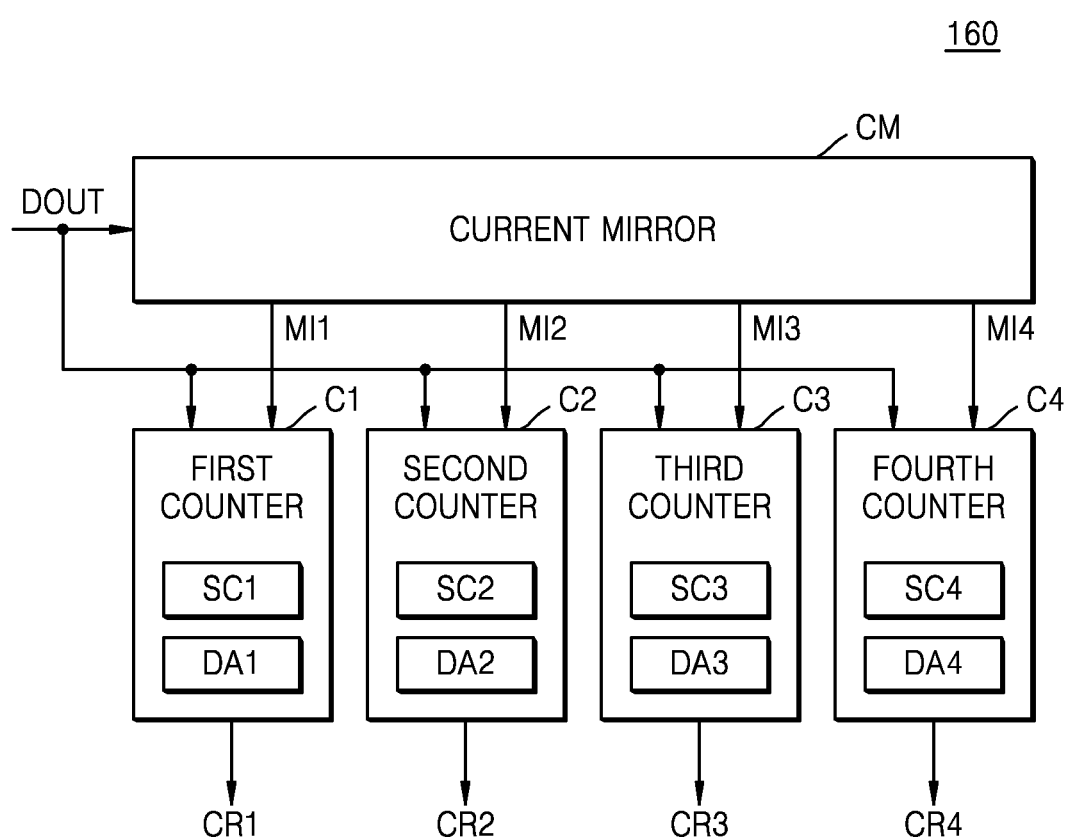
FIG. 15 is a block diagram of an analog bit counting unit according to an embodiment of the disclosure.

FIG. 15 is a block diagram of the analog bit counting unit according to an embodiment of the disclosure.

Referring to FIG. 15, an analog bit counting unit 160 may include a current mirror CM and first through fourth counters C1 through C4. However, the disclosure is not limited thereto, and the number of counters included in the analog bit counting unit 160 may be various according to embodiments.

The current mirror CM mirrors an input signal to output first through fourth mirror signals MI1 through MI4. According to an embodiment, an input signal may correspond to a decoder output signal DOUT. The first counter C1 may include a first sink circuit SC1 and a first differential amplifier DA1 and output a first count result CR1. The first sink circuit SC1 may be a current sink leaking current from the first mirror signal MI1. According to an embodiment, the first differential amplifier DA1 may compare a voltage according to the decoder output signal DOUT and a voltage according to the first mirror signal MI1 to output the first count result CR1. Second through fourth differential amplifiers DA2 through DA4 may operate substantially similarly to the first differential amplifier DA1.

Figure 16:
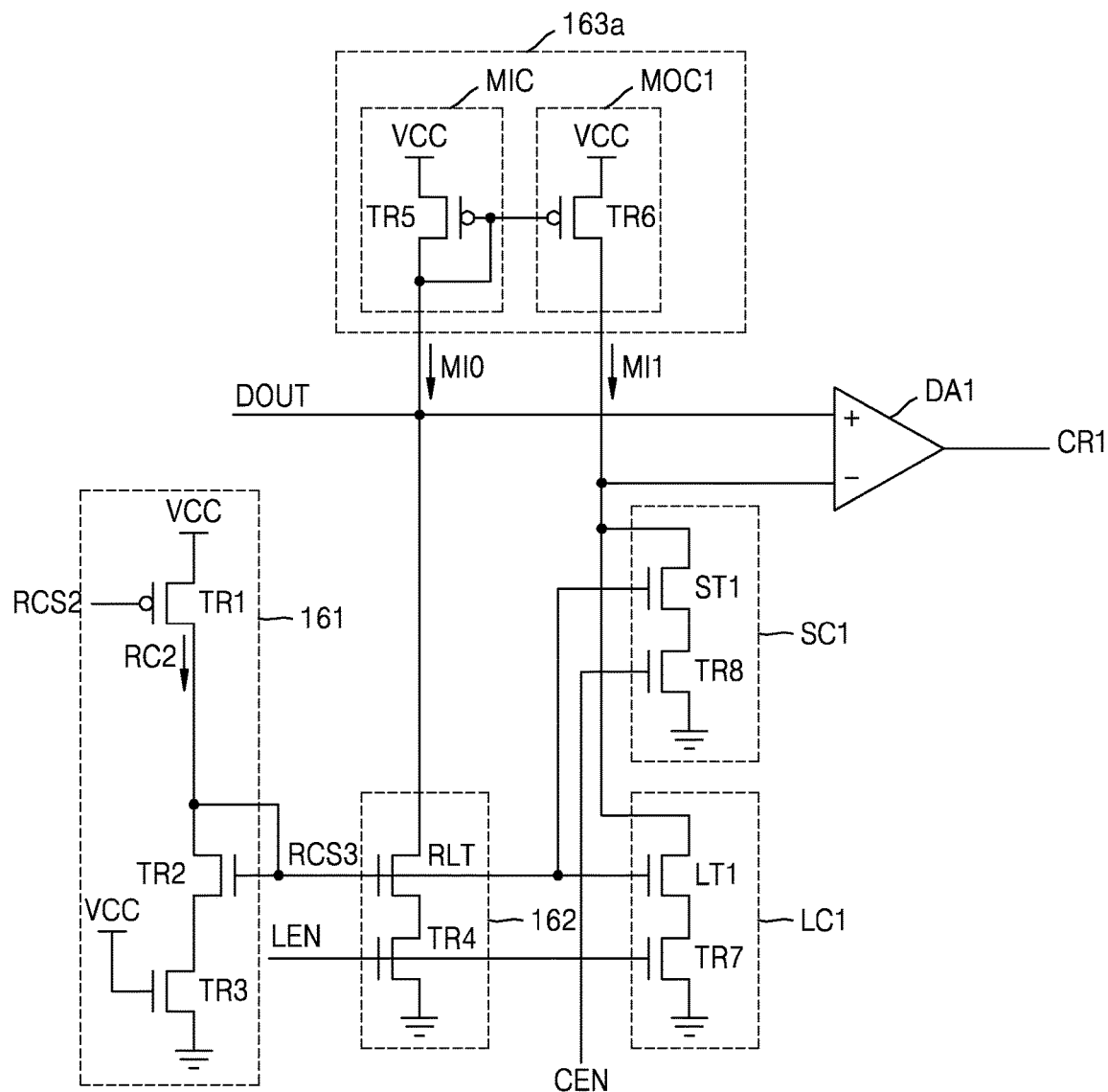
FIG. 16 is a circuit diagram of an analog bit counting unit according to an embodiment of the disclosure.

FIG. 16 is a circuit diagram of an analog bit counting unit according to an embodiment of the disclosure.

Referring to FIG. 16, an analog bit counting unit 160a may include a second reference current signal receiving unit 161, a reference load circuit 162, a current mirror 163a, a first sink circuit SC1, a first load circuit LC1, and a first differential amplifier DA1. The analog bit counting unit 160a according to the present embodiment is a specific embodiment of the analog bit counting unit 160a illustrated in FIG. 15. The first sink circuit SC1 and the first differential amplifier DA1 may correspond to the first counter C1, and only the first counter C1 is illustrated in FIG. 16 for convenience. The analog bit counting unit 160a may include more counters than one.

The second reference current signal receiving unit 161 may include first through third transistors TR1, TR2, and TR3. The first transistor TR1 may include a gate to which a second reference current signal RCS2 is applied, a source to which a power voltage VCC is applied, and a drain connected to the second transistor TR2. The second transistor TR2 may be connected between the first transistor TR1 and the third transistor TR3 and may be diode-connected. The third transistor TR3 may include a gate to which a power voltage VCC is applied, a drain connected to the second transistor TR2, and a source to which a ground voltage VSS is applied.

The first transistor TR1 may generate a second reference current RC2 in response to the second reference current signal RCS2, and the second reference current RC2 may be determined according to a size of the first transistor TR1 (for example, a size M1). For example, when receiving the second reference current signal RCS2 from the reference current generating unit 150 illustrated in FIG. 12, the second reference current RC2 may be determined according to the first current Ia flowing to the first feedback transistor FT1 and the size M1 of the first transistor TR1 (that is, RC2=Ia*M1). When a size of the first feedback transistor FT1 and a size of the first transistor TR1 are the same, the second reference current RC2 may be identical to the first current Ia.

The reference load circuit 162 may include a reference load transistor RLT and a fourth transistor TR4. The reference load transistor RLT may include a gate to which a third reference current signal RCS3 is applied. The gate of the reference load transistor RLT may be connected to a gate of the second transistor TR2 so that the reference load transistor RLT and the second transistor TR2 may operate as a current mirror.

The fourth transistor TR4 may include a gate to which a load enable signal LEN is applied and a source connected to a ground voltage terminal. When the load enable signal LEN is activated, the fourth transistor TR4 may be turned on, and the reference load transistor RLT may mirror the second reference current RC2. For example, the load enable signal LEN may be received from the controller 190 of FIG. 3.

A current mirrored by the reference load transistor RLT may be determined according to a size of the second transistor TR2, a size of the reference load transistor RLT, and the second reference current RC2. According to an embodiment, the second transistor TR2 may have the same structure and the same size as those of the reference load transistor RLT, and a current flowing to the reference load transistor RLT may be the same as the second reference current RC2.

The current mirror 163a may include a mirror input circuit MIC and a first mirror output circuit MOC1. The first mirror output circuit MOC1 may mirror an input signal MI0 to output a first mirror signal MI1. The input signal MI0 may correspond to a sum of currents leaked via the decoder output signal DOUT and the reference load circuit 162. The mirror input circuit MIC may include a fifth transistor TR5 that is diode-connected, and the first mirror output circuit MOC1 may include a sixth transistor TR6.

The first load circuit LC1 may include a load transistor LT1 and a seventh transistor TR7. The load transistor LT1 may include a gate to which a third reference current signal RCS3 is applied. The gate of the load transistor LT1 may be connected to the gate of the second transistor TR2 so that the load transistor LT1 and the second transistor TR2 may operate as a current mirror. The seventh transistor TR7 may include a gate to which a load enable signal LEN is applied and a source connected to a ground voltage terminal. When the load enable signal LEN is activated, the seventh transistor TR7 is turned on, and the load transistor LT1 may mirror the second reference current RC2.

A current mirrored by using the load transistor LT1 may be determined according to a size of the second transistor TR2, a size of the load transistor LT1, and the second reference current RC2. According to an embodiment, the load transistor LT1 may have the same structure and the same size as those of the reference load transistor RLT, and a current flowing to the load transistor LT1 may be the same as the second reference current RC2. The first load circuit LC1 may be a current sink that leaks the same amount of current as the reference load transistor RLT. The reference load circuit 162 may leak a current from the input signal MI0 of the current mirror 163a, and the first load circuit LC1 may leak a current from the output signal MI1 of the current mirror 163a.

The first sink circuit SC1 may include a sink transistor ST1 and an eighth transistor TR8. The sink transistor ST1 may include a gate to which a third reference current signal RCS3 is applied. A gate of the sink transistor ST1 is connected to a gate of the second transistor TR2 so that the sink transistor ST1 and the second transistor TR2 operate as a current mirror. The eighth transistor TR8 may include a gate to which a count enable signal CEN is applied and a source connected to a ground voltage terminal. For example, the count enable signal CEN may be received from the controller 190 of FIG. 3. When the count enable signal CEN is activated, the eighth transistor TR8 may be turned on, and the sink transistor SC1 may mirror the second reference current RC2.

The first differential amplifier DA1 may compare a voltage formed by the input signal MI0 of the current mirror 163a with a voltage formed by the first mirror signal MI1 which is an output signal of the current mirror 163a. In detail, the first differential amplifier DA1 may output a comparison result as a first count result CR1.

Figure 17:
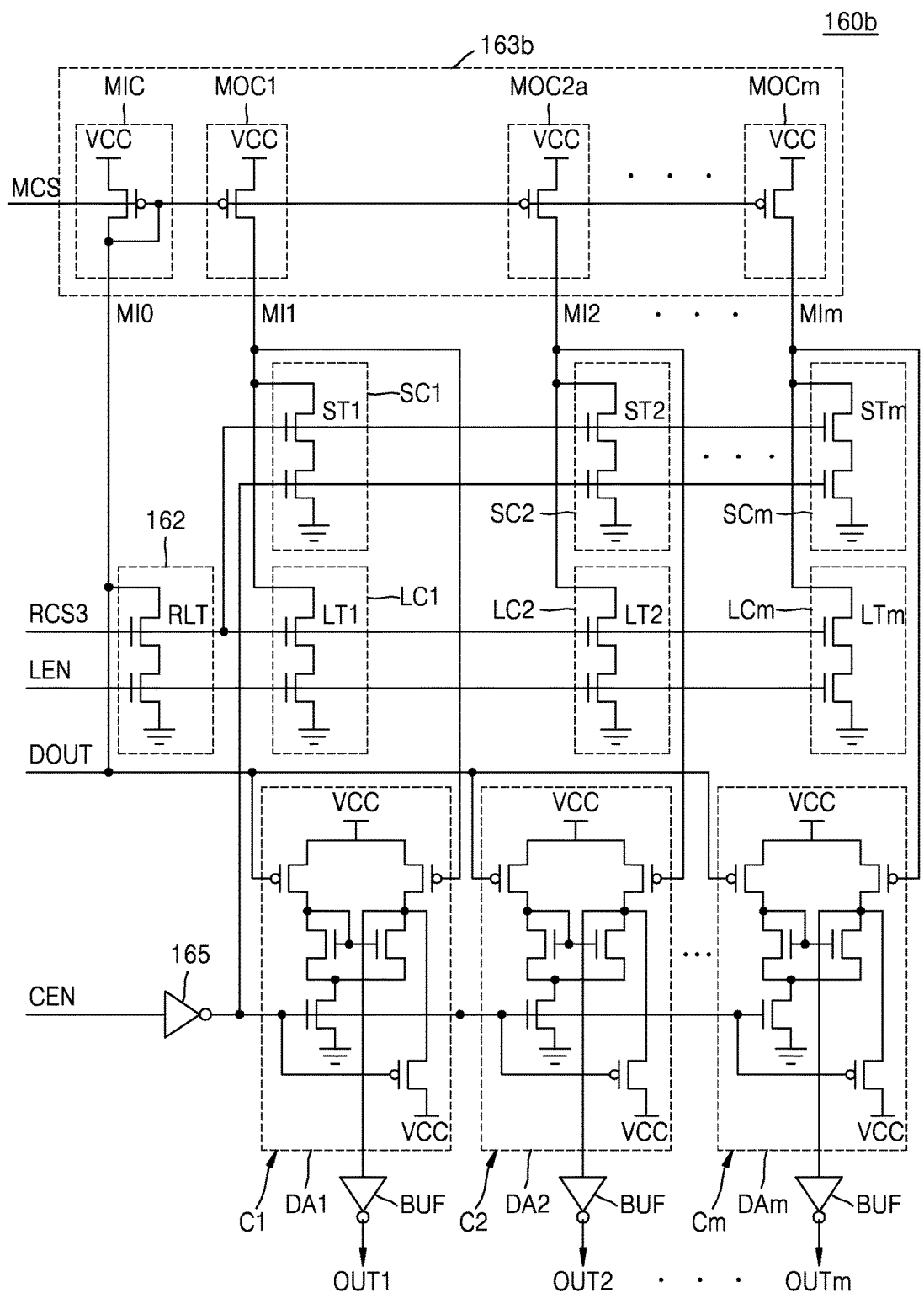
FIG. 17 is a detailed circuit diagram of an analog bit counting unit according to an embodiment of the disclosure.

FIG. 17 is a detailed block diagram of an analog bit counting according to an embodiment of the disclosure.

Referring to FIG. 17, an analog bit counting unit 160b may include a reference load circuit 162, a current mirror 163b, first through mth sink circuits SC1 through SCm, first through mth load circuits LC1 through LCm, and first through mth differential amplifiers DA1 through DAm. The analog bit counting unit 160b according to the present embodiment may include first through mth counters C1 through Cm, and each of the first through mth counters C1 through Cm may operate substantially in a similar manner as those illustrated in FIG. 16.

The reference load circuit 162 may be connected to a ground voltage node in response to the load enable signal LEN. The reference load circuit 162 may include a reference load transistor RLT, and the reference load transistor RLT may operate in response to a third reference current signal RCS3.

The current mirror 163b may include a mirror input circuit MIC and first through mth mirror output circuits MOC1 through MOCm. The first through mth mirror output circuits MOC1 through MOCm may mirror an input signal MI0 to output a plurality of mirror signals MI1 through MIm, under control of a maximum current signal MCS.

The first through mth load circuits LC1 through LCm may be current sinks that leak current from the first through mth mirror signals MI1 through MIm. The first through mth load circuits LC1 through LCm may be connected to ground voltage nodes in response to a load enable signal LEN. Each of the first through mth load circuits LC1 through LCm may include load transistors LT1 through LTm. The first through mth load circuits LC1 through LCm may respectively leak current from mirror signals MI1 through MIm of the current mirror 163b.

First through mth sink circuits SC1 through SCm may be current sinks that leak current from the first through mth mirror signals MI1 through MIm. The first through mth sink circuits SC1 through SCm may be connected to ground voltage nodes in response to a count enable signal CEN. The first through mth sink circuits SC1 through SCm may respectively include sink transistors ST1 through STm. According to an embodiment, the first through mth sink transistors ST1 through STm may have different widths from one another. When the first through mth sink transistors ST1 through STm have different widths from one another, the first through mth sink circuits SC1 through SCm may leak different amounts of current from the first through mth signals MI1 through MIm.

First through mth differential amplifiers DA1 through DAm may be activated or inactivated in response to the count enable signal CEN, which may be inverted by inverter 165. When the count enable signal CEN is logic low, a ground voltage VSS is supplied to the first through mth differential amplifiers DA1 through DAm, and the first through mth differential amplifiers DA1 through DAm are activated. When the count enable signal CEN is logic high, a ground voltage VSS is not supplied to the first through mth differential amplifiers DA1 through DAm, and the first through mth differential amplifiers DA1 through DAm are inactivated. When the first through mth differential amplifiers DA1 through DAm are inactivated, a power voltage VCC may be supplied to outputs of the first through mth differential amplifiers DA1 through DAm in response to the count enable signal CEN.

The first through mth differential amplifiers DA1 through Dam may compare a voltage formed by the input signal MI0 of the current mirror 163b and a voltage formed by the first through mth mirror signals MI1 through MIm which are output signals of the current mirror 163b. Buffers BUF may invert a comparison result output from the first through mth differential amplifiers DA1 through Dam to output the comparison result as first through mth count results OUT1 through OUTm.

Figure 18:
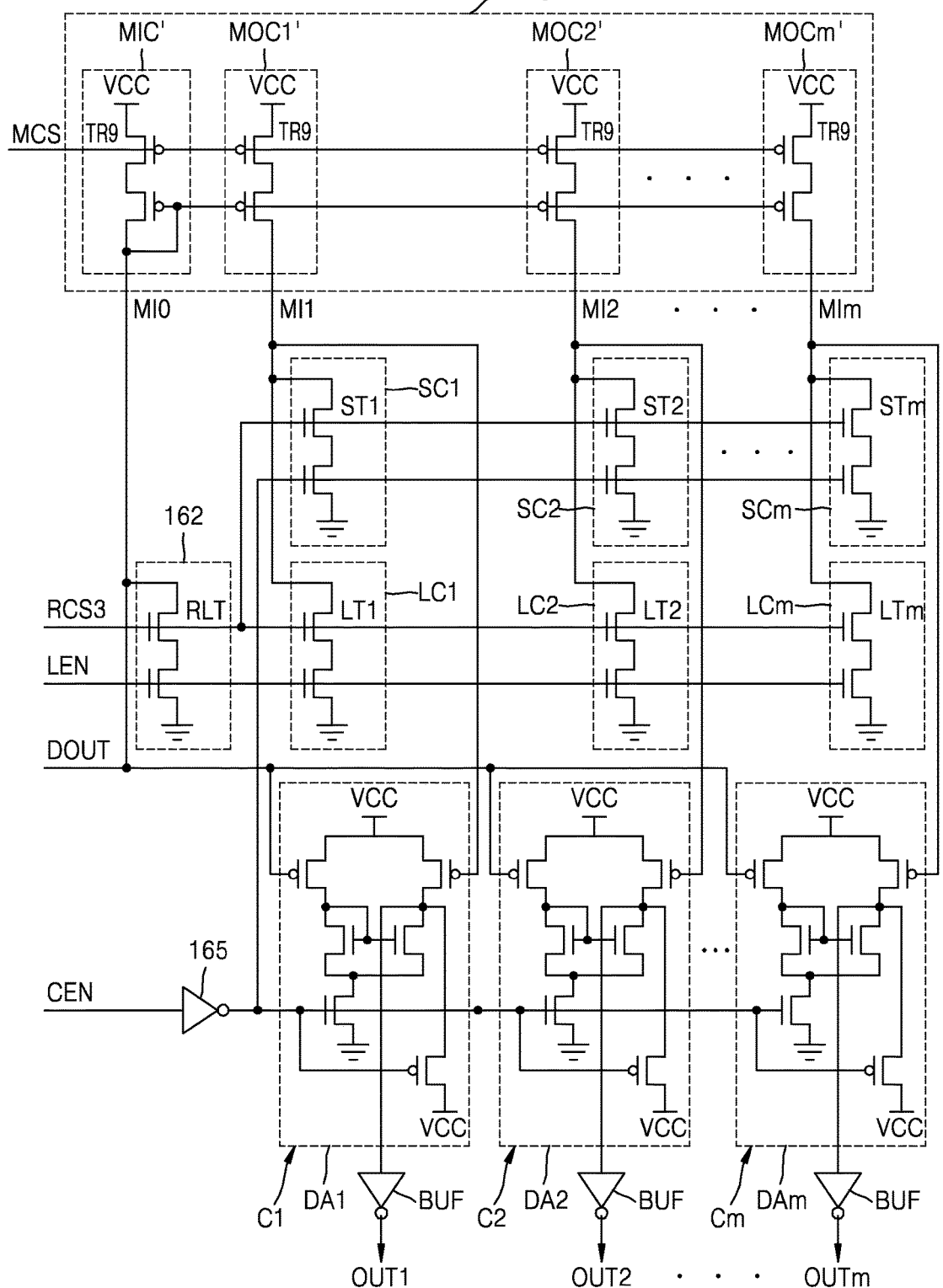
FIG. 18 is a detailed circuit diagram of an analog bit counting unit according to an embodiment of the disclosure.

FIG. 18 is a detailed block diagram of an analog bit counting unit according to an embodiment of the disclosure.

Referring to FIG. 18, an analog bit counting unit 160c is a modified example of the analog bit counting unit 160b illustrated in FIG. 17 and may operate substantially in a similar manner as the analog bit counting unit 160b illustrated in FIG. 17 except for a current mirror 163c. A mirror input circuit MIC' and first through mth mirror output circuits MOC1' through MOCm' included in the current mirror 163c may each further include a ninth transistor TR9 having a gate to which a maximum current signal MCS is applied. Accordingly, a maximum current that may leak from the current mirror 163c may be limited, and accordingly, current consumption may be reduced.

Figure 19:
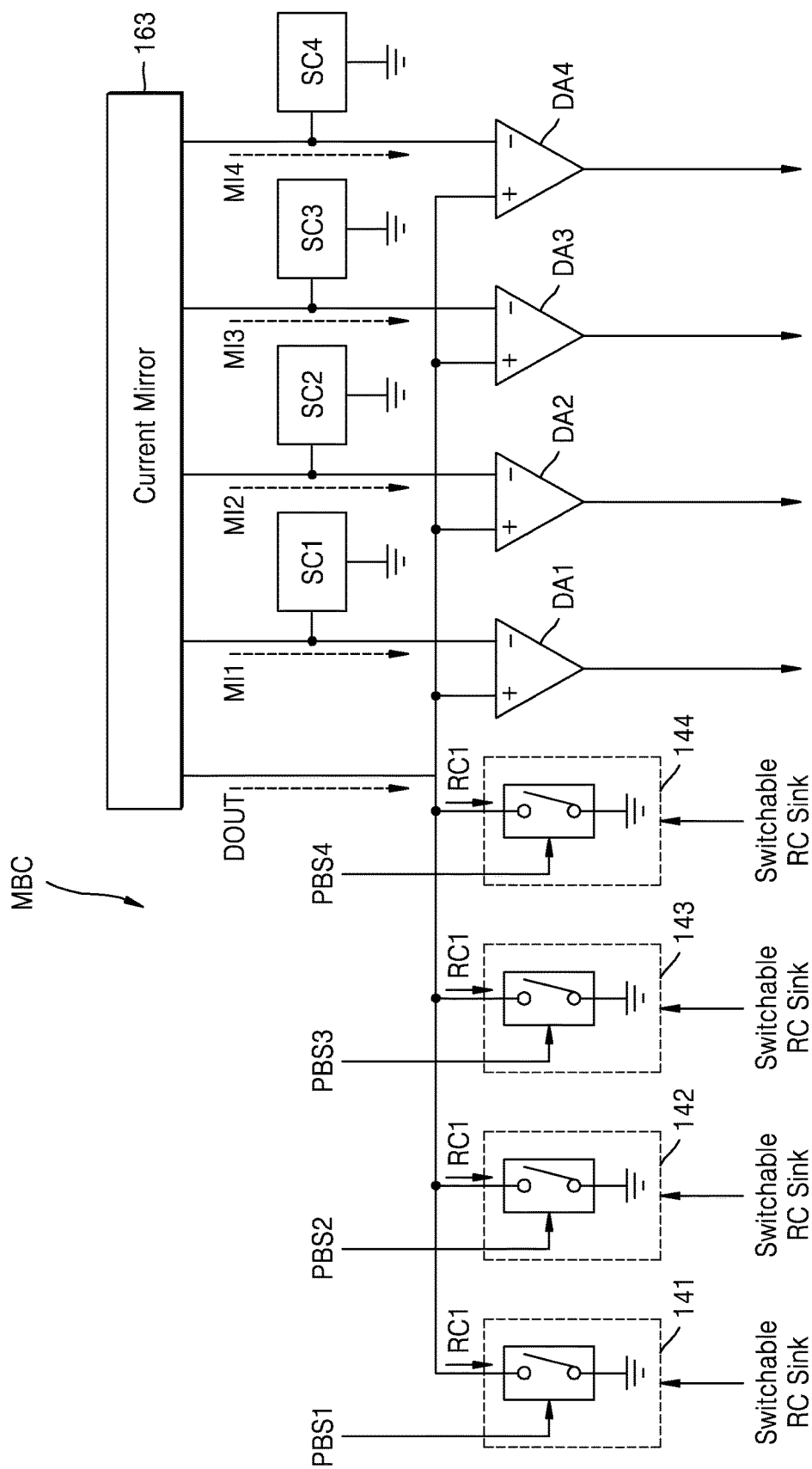
FIG. 19 is a simplified block diagram of a portion of a mass bit counter according to an embodiment of the disclosure.

FIG. 19 is a simplified block diagram of a portion of a mass bit counter according to an embodiment of the disclosure.

Referring to FIG. 19, a mass bit counter MBC may include first through fourth page buffer decoders 141 through 144, a current mirror 163, first through fourth sink circuits SC1 through SC4, and first through fourth differential amplifiers DA1 through DA4. For convenience, the reference load circuit 162 and the first through mth load circuits LC1 through LCm are not illustrated. The first through fourth page buffer decoders 141 through 144 may be current sinks that operate in response to page buffer signals PBS1 through PBS4. While four page decoders 141 through 144 are illustrated, the number of page buffer decoders is not limited thereto.

Each of the first through fourth page buffer decoders 141 through 144 may leak a first reference current RC1 generated in response to a first reference current signal RCS1. A page buffer decoder to which a page buffer signal indicating a fail bit is applied may leak the first reference current RC1. A decoder output signal DOUT may be a total sum of currents output from the first through fourth page buffer decoders 141 through 144.

The current mirror 163 may mirror a decoder output signal DOUT to output the first through fourth mirror signals MI1 through MI4. The first through fourth sink circuits SC1 through SC4 may respectively leak current from the first through mirror signals MI1 through MI4. An amount of current leaked from the first through fourth sink circuits SC1 through SC4 may be determined based on a size of sink transistors (for example, the sink transistor ST1 of FIG. 16).

The decoder output signal DOUT flows through a positive input end of the first differential amplifier DA1. The current mirror 163 supplies a first mirror signal MI1 which is the same as the decoder output signal DOUT to a negative input end of the first differential amplifier DA1. The first sink circuit SC1 leaks a predetermined voltage from the negative input end of the first differential amplifier DA1. When an amount of current leaking via the first sink circuit SC1 is smaller than the first mirror signal MI1 a voltage of the negative input end of the first differential amplifier DA1 is increased, and the first differential amplifier DA1 outputs a logic low. When an amount of current leaked via the first sink circuit SC1 is greater than the first mirror signal MI1 the first differential amplifier DA1 outputs a logic high.

Likewise, the second through fourth differential amplifiers DA2 through DA4 may output a logic high or a logic low based on whether an amount of current leaking from second through fourth sink circuits SC2 through SC4 is greater or smaller than the decoder output signal DOUT. By adjusting an amount of current leaked via the first through fourth sink circuits SC1 through SC4, outputs of the first through fourth differential amplifiers DA1 through DA4 may be set to indicate information about the number of fail bits.

Figure 20:
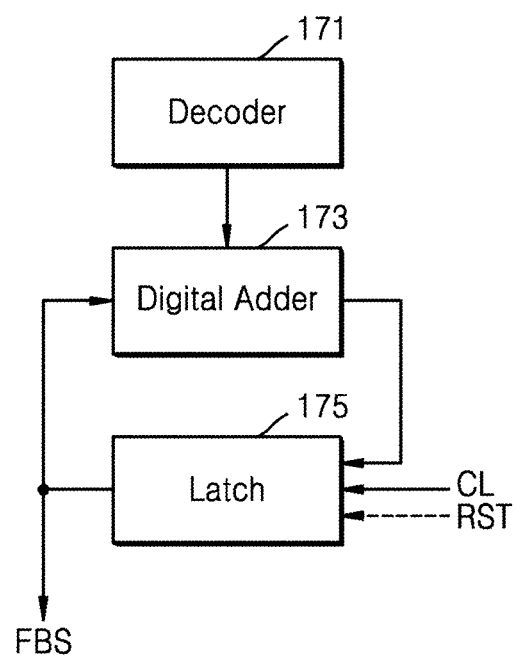
FIG. 20 is a block diagram illustrating a digital adding unit according to an embodiment of the disclosure.

FIG. 20 is a block diagram illustrating a digital adding unit according to an embodiment of the disclosure.

Referring to FIG. 20, a digital adding unit 170 may include a decoder 171, a digital adding unit 173, and a latch 175. Hereinafter, a structure and operation of the digital adding unit 170 will be described with reference to FIGS. 3 and 20.

The decoder 171 receives count results OUT from the analog bit counting unit 160. The decoder 171 may convert the received count results OUT into digital values (for example, digital bits) of a predetermined number system. For example, the decoder 171 may convert count results OUT into digital values of one of various number systems such as the binary system, the octal number system, the decimal system, or the hexadecimal system.

The digital adding unit 173 receives a digital value from the decoder 171. The digital adding unit 173 may add a value stored in the latch 175 (for example, digital bits) to the digital value output from the decoder 171. An input node of the latch 175 may be connected to an output node of the digital adding unit 173. An output node of the latch 175 may be connected to the digital adding unit 173 and a fail bit signal FBS may be output from the output node of the latch 175. The latch 175 operates in response to a latch signal CL and a reset signal RST. When the reset signal RST is activated, the latch 175 may be reset. For example, the latch signal CL and the reset signal RST may be provided by the controller 190. When the latch signal CL is activated, the latch 175 stores an output value of the digital adding unit 173.

According to an embodiment, the controller 190 may determine a ratio between a first reference current and a second reference current based on at least one of the number of times of a program loop, a program state to be detected, and a storage mode of a memory cell to be detected, and generate a ratio control signal according to the determined rate. The controller 190 may provide the ratio control signal to the digital adding unit 170, and the digital adding unit 170 may operate according to the ratio control signal.

Figure 21:
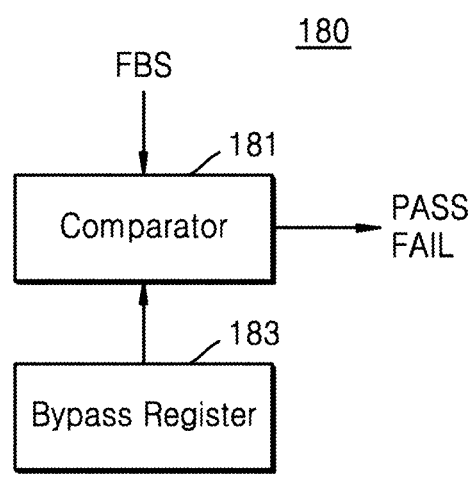
FIG. 21 is a block diagram illustrating a pass/fail checking unit according to an embodiment of the disclosure.

FIG. 21 is a block diagram illustrating the pass/fail checking unit according to an embodiment of the disclosure.

Referring to FIG. 21, a pass/fail checking unit 180 may include a comparator 181 and a bypass register 183. Hereinafter, a structure and operation of the pass/fail checking unit 180 will be described with reference to FIGS. 3 and 21.

The comparator 181 receives a fail bit signal FBS from the digital adding unit 170. The bypass register 183 is configured to store a bypass value. The bypass value may be the number of fail bits that may be ignored during a program operation. According to an embodiment, the bypass register 183 may store a plurality of bypass values respectively corresponding to a plurality of program states. When a value of the fail bit signal FBS is equal to or smaller than a bypass value, the comparator 181 may output a pass signal PASS. When a value of the fail bit signal FBS is greater than a bypass value, the comparator 181 may output a fail signal FAIL.

According to an embodiment, the controller 190 may determine a ratio between a first reference current and a second reference current based on at least one of the number of times of a program loop, a program state to be detected, and a storage mode of a memory cell to be detected, and generate a ratio control signal according to the determined rate. The controller 190 may provide the ratio control signal to the pass/fail checking unit 180, and the pass/fail checking unit 180 may operate according to the ratio control signal.

Figure 22:
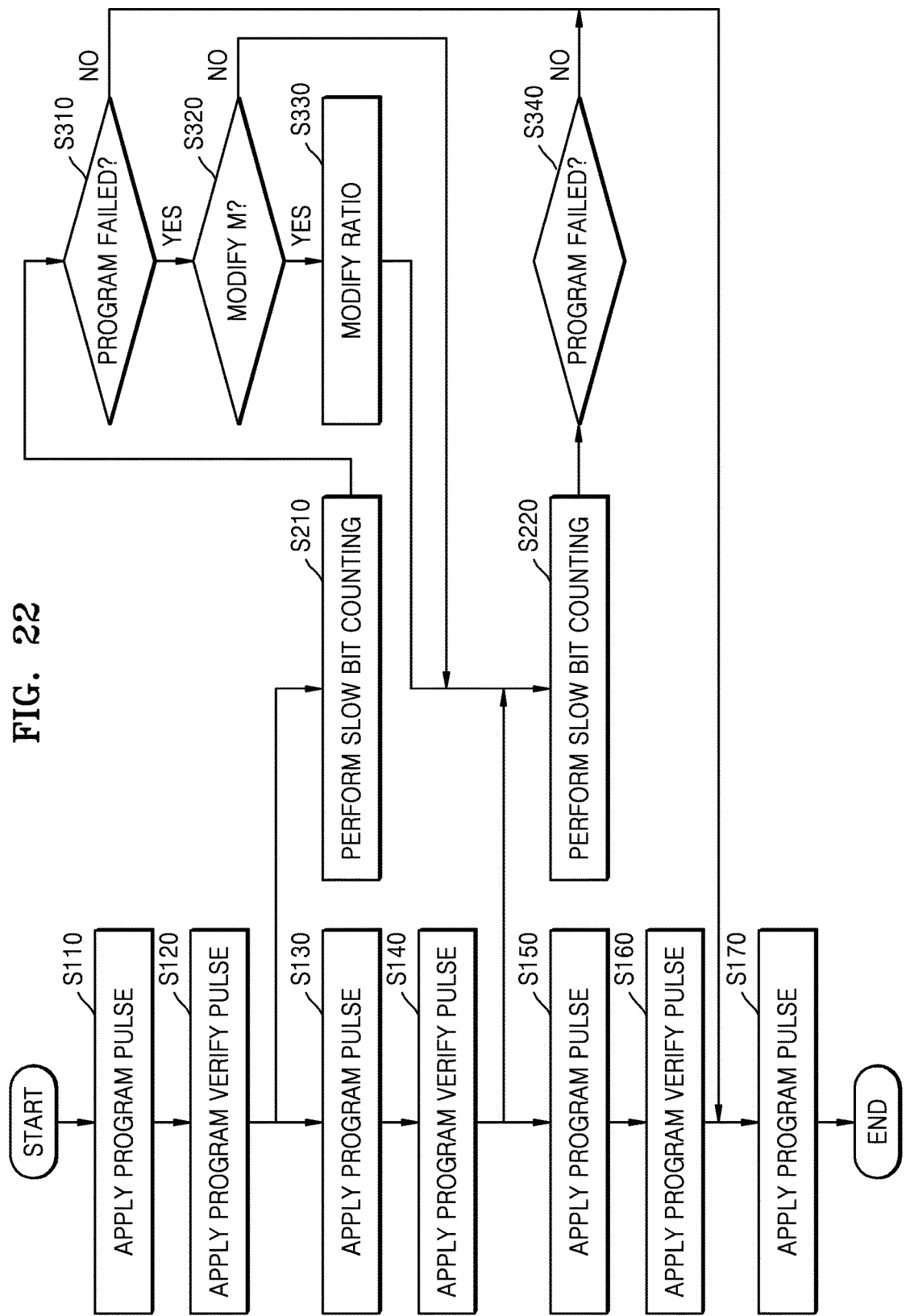
FIG. 22 is a flowchart of a method of operating a memory device according to an embodiment of the disclosure.

FIG. 22 is a flowchart of a method of operating a memory device according to an embodiment of the disclosure.

Referring to FIG. 22, the method of operating a memory device according to the present embodiment is performed in a sequence in a memory device, and may include, for example operations that are performed in a sequence in the memory device 100 of FIG. 3. Description provided with reference to FIGS. 1 through 21 above may also apply to the present embodiment, and repeated description will be omitted.

In operation S110, a program pulse is applied to the memory cell array 105, and in operation S120, a program verify pulse is applied to the memory cell array 105. Operations S110 and S120 may constitute a first program loop. A verify read result of memory cells according to application of a program verify pulse may be stored in the page buffer group 120. In operation S130, a program pulse is applied to the memory cell array 105, and in operation S140, a program verify pulse is applied to the memory cell array 105. Operations S130 and S140 may constitute a second program loop.

In operation S210, a slow bit counting operation is performed on the verify read result. Operation S210 may be performed while operation S130 is performed. In detail, the page buffer decoding unit 140 may generate a decoder output signal DOUT corresponding to the number of fail bits multiplied by a first reference current, from page buffer signals output from the page buffer group 120, and the analog bit counting unit 160 may compare m times the first reference current with the decoder output signal DOUT to output a count result corresponding to the number of fail bits.

In operation S310, it is determined whether a program operation is failed based on the count result. When a program fail is determined, operation S320 is performed, and when a program pass is determined, operation S170 is performed. In detail, the pass/fail checking unit 180 may output a fail signal when the number of fail bits according to the count result is greater than a bypass value, and otherwise, the pass/fail checking unit 180 may output a pass signal.

In operation S320, it is determined whether a ratio M of a first reference current and a second reference current is to be modified. As a result of the determination, when the ratio M is modified, operation S330 is performed, and when the ratio M is not modified, operation S220 is performed. In detail, the controller 190 may determine whether to modify the ratio M based on at least one of the number of times of a program loop, a program state to be detected, a storage mode of a memory cell to be detected, the number of reference fail bits according to program deterioration, and the number of reference fail bits according to a read retry operation. A storage mode of a memory cell may be a single-level cell mode, a multi-level cell mode or a triple-level cell mode.

According to an embodiment, program deterioration may correspond to endurance of a memory device, and endurance of a memory device may be determined based on a program/erase cycle. According to an embodiment, program deterioration may correspond to retention of a memory device, and retention of a memory device may be determined based on, for example, a program order stamp (POS). The number of reference fail bits may be modified according to program deterioration, and accordingly, the ratio M may have to be modified.

According to an embodiment, a read retry operation may be performed by performing a read operation on memory cells at different voltage levels, counting the number of memory cells corresponding to each threshold voltage region based on a read result, and determining an optimum read level based on the number of counted memory cells. The read retry operation may be referred to as a valley search. When counting the number of memory cells corresponding to each threshold voltage region, a fail bit counter, for example, a slow bit counter may be used. Here, the number of reference fail bits used to count the number of memory cells corresponding to each threshold voltage region may be modified, and accordingly, the ratio M may have to be modified.

In operation S330, the ratio M of the first reference current and the second reference current is modified. In detail, the controller 190 may modify the ratio M based on at least one of the number of times of a program loop, a program state to be detected, a storage mode of a memory cell to be detected, and generate a ratio control signal according to the modified rate. The controller 190 may provide the ratio control signal to the digital adding unit 170 and the pass/fail checking unit 180.

In operation S150, a program pulse is applied to the memory cell array 105, and in operation S160, a program verify pulse is applied to the memory cell array 105. Operations S150 and S160 may constitute a third program loop.

In operation S220, a slow bit counting operation is performed on a verify read result. Operation S220 may be performed while operation S150 is performed. In detail, the page buffer decoding unit 140 may generate a decoder output signal DOUT corresponding to the number of fail bits multiplied by a first reference current, from page buffer signals output from the page buffer group 120, and the analog bit counting unit 160 may compare m times the first reference current with the decoder output signal DOUT to output a count result corresponding to the number of fail bits.

In operation S340, it is determined whether a program operation is failed based on the count result. When a program pass is determined, operation S170 is performed, and when a program fail is determined, a fail signal is output. In detail, the pass/fail checking unit 180 may output a fail signal when the number of fail bits according to the count result is greater than a bypass value, and otherwise, the pass/fail checking unit 180 may output a pass signal. In some embodiments, when the fail signal is output, a fourth program loop may be performed, that is, a program pulse and a program verify pulse may be sequentially applied to the memory cell array 105. In some embodiments, when the fail signal is output, operations S320 and S330 may be sequentially performed.

In operation S170, a program pulse is applied to the memory cell array 105. Accordingly, an additional program pulse is applied to slow bits having a threshold voltage that is lower than a program verify voltage, the number of fail bits may be further reduced. Operation 170 may constitute a last program loop, and a program verify operation may be omitted in the last program loop. Accordingly, a total program period may be reduced.

Figure 23:
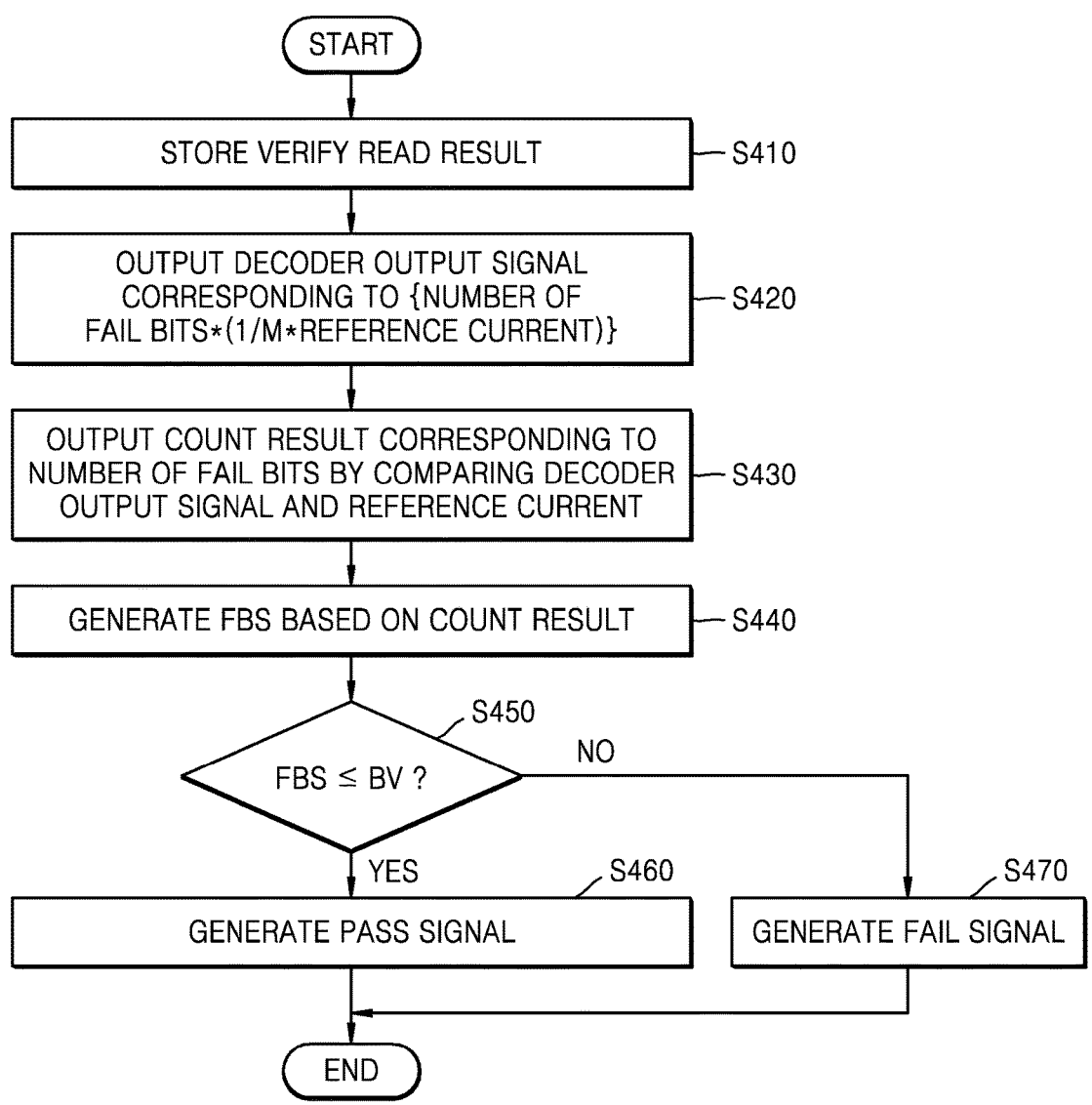
FIG. 23 is a flowchart of a program verify method of a memory device according to an embodiment of the disclosure.

FIG. 23 is a flowchart of a program verify method of a memory device according to an embodiment of the disclosure.

Referring to FIG. 23, the program verify method of a memory device according to the present embodiment is performed in a sequence in a memory device, and may include, for example, operations that are performed in a sequence in the memory device 100 of FIG. 3. The description provided with reference to FIGS. 1 through 22 above may also apply to the present embodiment, and repeated description will be omitted. The program verify method of the memory device according to the present embodiment may correspond to operations S210 and S310 of FIG. 22.

In operation S410, the page buffer group 120 stores a verify read result. According to an embodiment, the page buffer group 120 may output information about the verify read result as a page buffer signal PBS in response to a transmission signal PF. According to an embodiment, the page buffer group 120 may include a plurality of page buffers connected to a plurality of page buffer signal lines, the plurality of page buffers may be divided into a plurality of multi-stage structures STAGE1 through STAGEn, and page buffers of each multi-stage structure may be connected in common to one page buffer signal line.

In operation S420, the page buffer decoding unit 140 may output a decoder output signal corresponding to the number of fail bits multiplied by (1/M*reference current). The reference current may correspond to a second reference current applied to the analog bit counting unit 160. In operation S430, the analog bit counting unit 160 outputs a count result corresponding to the number of bits by comparing the decoder output signal and the reference current.

In operation S440, the pass/fail checking unit 180 generates a fail bit signal FBS based on the count result. In operation S450, whether the fail bit signal FBS is equal to or less than a bypass value BV is determined. As a result of the determination, when the fail bit signal FBS is equal to or less than the bypass value BV, operation S460 is performed, and when the fail bit signal FBS is greater than the bypass signal BV, operation S470 is performed.

In operation S460, the pass/fail checking unit 180 generates a pass signal PASS. Accordingly, the controller 190 may control the memory device 100 overall to omit a program verify operation in a last program loop, and the program operation mode may be ended.

In operation S470, the pass/fail checking unit 180 generates a fail signal FAIL.

Figure 24:
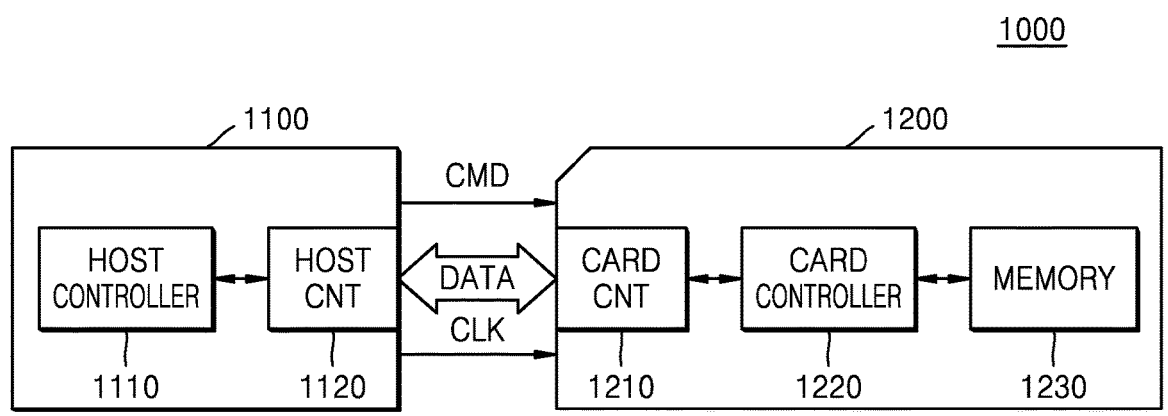
FIG. 24 is a block diagram of a memory card system according to embodiments of the disclosure.

FIG. 24 is a block diagram illustrating a memory card system according to embodiments of the disclosure.

Referring to FIG. 24, a memory card system 1000 may include a host 1100 and a memory card 1200. The host 1100 may include a host controller 1110 and a host connector 1120. The memory card 1200 may include a card connector 1210, a card controller 1220, and a memory device 1230. In this case, the memory card 1200 may be embodied according to the embodiments shown in FIGS. 1 to 23.

In detail, the memory card 1200 may include a page buffer group generating page buffer signals according to a verify read result of memory cells, a page buffer decoding unit generating a decoder output signal corresponding to the number of fail bits from the page buffer signals, a slow bit counter outputting a count result corresponding to the number of fail bits from a decoder output signal based on a second reference current corresponding to M times the first reference current, where M is a positive integer, and a pass/fail checking unit determining a program pass with respect to the memory cells based on the count result to output a pass signal or a fail signal.

The memory card 1200 may be embodied to communicate with the host 1100 by using at least one of a Universal Serial Bus (USB), a Multimedia Card (MMC), a Peripheral Component Interconnect Electronics (PCI-E), an Advanced Technology Attachment (ATA), a Serial-ATA, a Parallel-ATA, a Small Computer System Interface (SCSI), an Enhanced Small Device Interface (ESDI), and an Integrated Drive Electronics (IDE).

The host 1100 may write data to or read data, DATA, from the memory card 1200. The host controller 1110 may transmit a command CMD, a clock signal CLK generated by a clock generator (not shown) included in the host 1100, and data DATA to the memory card 1200 via the host connector 1120.

The card controller 1220 may store data in the memory device 1230 in synchronization with a clock signal generated by a clock generator (not shown) included in the card controller 1220, in response to the command CMD received via the card connector 1210. The memory device 1230 may store the data DATA transmitted from the host 1100.

The memory card 1200 may be embodied as a compact flash card (CFC), a micro-drive, a smart media card (SMC), a multimedia card (MMC), a security digital card (SDC), a memory stick, a USB flash memory driver, etc.

Figure 25:
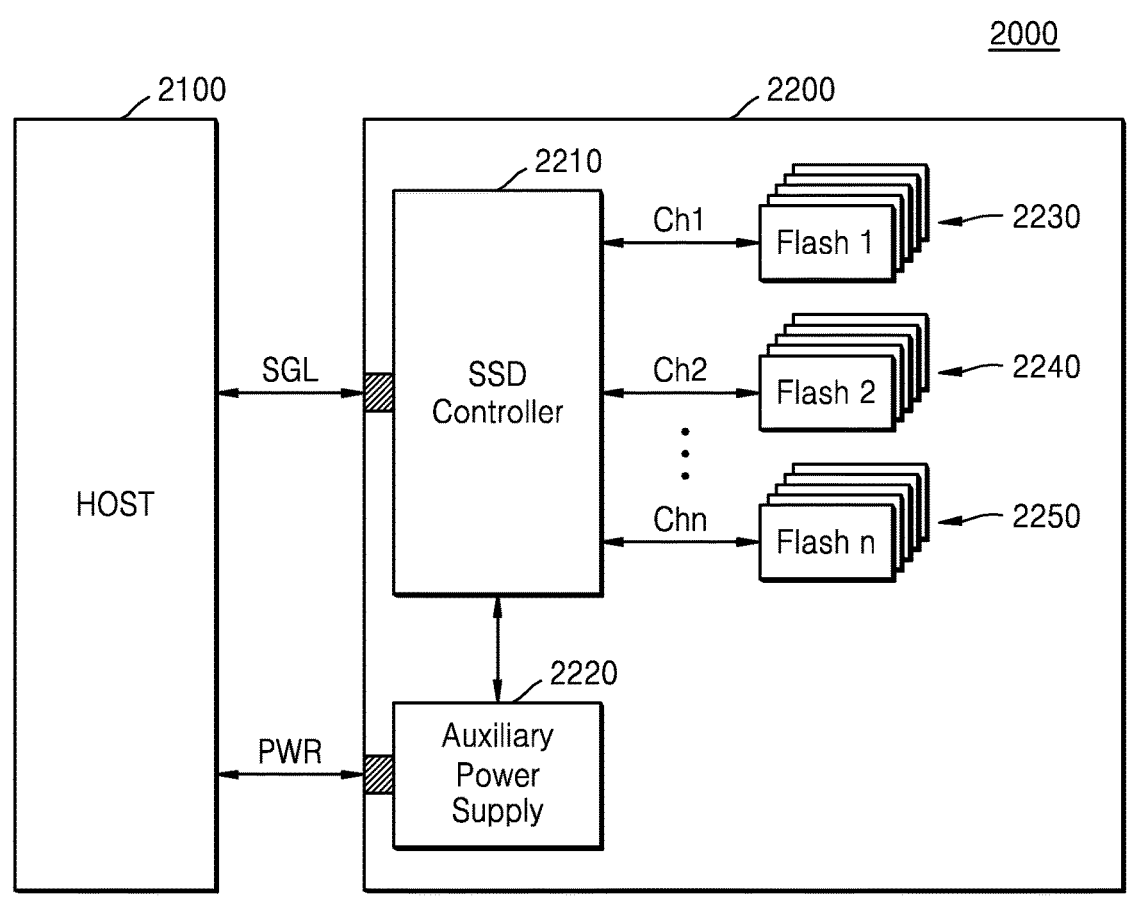
FIG. 25 is a block diagram of a solid-state drive (SSD) system according to an embodiment of the disclosure.

FIG. 25 is a block diagram illustrating a solid-state disk (SSD) system to which a memory device according to an embodiment of the disclosure is applied.

Referring to FIG. 25, an SSD system 2000 may include a host 2100 and an SSD 2200. The SSD 2200 may exchange signals SGL with the host 2100 through a signal connector and receive power PWR through a power connector. The SSD 2200 may include an SSD controller 2210, an auxiliary power supply 2220, and a plurality of memory devices 2230, 2240, and 2250. In this case, the SSD 2200 may be embodied according to the embodiments shown in FIGS. 1 to 24.

In detail, the plurality of memory devices 2230 through 2250 may include a page buffer group generating page buffer signals according to a verify read result of the memory cells, a page buffer decoding unit generating a decoder output signal corresponding to the number of fail bits from the page buffer signals, a slow bit counter outputting a count result corresponding to the number of fail bits from a decoder output signal based on a second reference current corresponding to M times the first reference current, where M is a positive integer, and a pass/fail checking unit determining a program pass with respect to the memory cells based on the count result to output a pass signal or a fail signal.

A memory card, a non-volatile memory device, and a card controller according to the disclosure may be mounted using various types of packages. For example, a flash memory device and/or a memory controller according to an embodiment of the disclosure may be mounted using various packages, e.g., a package-on-package (PoP), ball grid arrays (BGAs), chip scale packages (CSPs), a plastic leaded chip carrier (PLCC), a plastic dual in-line package (PDIP), a die-in-waffle pack, a die-in-wafer form, a chip-on-board (COB), a ceramic dual in-line package (CERDIP), a plastic metric quad flat pack (MQFP), a thin quad flatpack (TQFP), a small outline (SOIC), a shrink small outline package (SSOP), a thin small outline (TSOP), a system-in-package (SIP), a multi-chip package (MCP), a wafer-level fabricated package (WFP), a wafer-level processed stack package (WSP), etc.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure.

While the disclosure has been particularly shown and described with reference to embodiments thereof, it will be understood that various changes in form and details may be made therein without departing from the spirit and scope of the following claims.

What is claimed is:

1. A non-volatile memory device comprising:
a memory cell array including memory cells;
a page buffer group configured to generate page buffer signals according to a verify read result of the memory cells;
a page buffer decoding unit configured to generate a decoder output signal corresponding to a number of fail bits from the page buffer signals based on a first reference current;
a slow bit counter configured to output a count result corresponding to the number of fail bits from the decoder output signal based on a second reference current corresponding to M times the first reference current, where M is a positive integer;
a pass/fail checking unit configured to determine a program outcome with respect to the memory cells based on the count result and to output a pass signal or a fail signal based upon the determined program outcome;
a reference current generating unit configured to generate a first reference current signal corresponding to the first reference current and a second reference current signal corresponding to the second reference current such that the second reference current is M times the first reference current; and
a controller configured to generate a ratio control signal used to control a ratio of the first reference current and the second reference current according to a maximum number of fail bits to be detected, and provide the ratio control signal to the reference current generating unit.

2. The non-volatile memory device of claim 1, wherein the slow bit counter comprises an analog bit counting unit configured to output the count result based on a voltage according to the decoder output signal and a voltage according to the second reference current signal.

3. The non-volatile memory device of claim 2, wherein:
the first reference current is a current leaking from the page buffer decoding unit when the number of fail bits from the page buffer signals is one, and
the second reference current is a reference current flowing from the analog bit counting unit to output the count result.

4. The non-volatile memory device of claim 2, wherein the count result corresponds to a result of comparing a voltage according to a sink current corresponding to the second reference current and the voltage according to the decoder output signal.

5. The non-volatile memory device of claim 1, wherein:
the controller determines the ratio based on at least one of the number of times of a program loop, a program state to be detected, a storage mode of a memory cell to be detected, a number of reference fail bits according to program deterioration, and a number of reference fail bits according to a read retry operation, and generates the ratio control signal based on the rate, and
the storage mode of the memory cell is a single-level cell mode, a multi-level cell mode or a triple-level cell mode.

6. The non-volatile memory device of claim 1, further comprising:
a digital adding unit configured to generate a fail bit signal by calculating a cumulative sum of the count result, and provide the fail bit signal to the pass/fail checking unit, wherein
the controller is configured to further provide the ratio control signal to the digital adding unit.

7. The non-volatile memory device of claim 6, wherein: the pass/fail checking unit comprises:
a bypass register configured to store a bypass value; and
a comparator configured to compare the fail bit signal and the bypass value, and output the fail signal when the fail bit signal is greater than the bypass value, and output the pass signal when the fail bit signal is smaller than the bypass value, and
the controller further provides the ratio control signal to the comparator.

8. The non-volatile memory device of claim 1, wherein when the fail signal is output from the pass/fail checking unit, the controller selectively modifies the ratio control signal.

9. The non-volatile memory device of claim 1, wherein when the pass signal is output from the pass/fail checking unit, the controller controls the non-volatile memory device such that a program verify operation on the memory cells is not performed.

10. The non-volatile memory device of claim 1, wherein:
the page buffer group comprises a plurality of page buffers connected to a plurality of page buffer signal lines,
the plurality of page buffers are divided into a plurality of multi-stage structures, and
the page buffers of the multi-stage structures are connected in common to one page buffer signal line.

11. The non-volatile memory device of claim 1, wherein the memory cell array comprises a three-dimensional memory array.

12. The non-volatile memory device of claim 11, wherein the three-dimensional memory array comprises a plurality of memory cells, and each of the plurality of memory cells comprises a charge trap layer.

13. The non-volatile memory device of claim 11, wherein:
the three-dimensional memory array comprises a non-volatile memory monolithically formed in at least one physical level of memory cells having an active region disposed on a silicon substrate, and
word lines or bit lines in the three-dimensional memory array are shared between levels.

14. A memory system comprising:
a non-volatile memory device; and
a memory controller configured to control the non-volatile memory device,
wherein the non-volatile memory device comprises:
   a memory cell array including memory cells;
   a page buffer group configured to generate page buffer signals according to a verify read result of the memory cells;
   a page buffer decoding unit configured to generate a decoder output signal corresponding to a number of fail bits from the page buffer signals, based on a first reference current;
   a slow bit counter configured to output a count result corresponding to the number of fail bits from the decoder output signal based on a second reference current corresponding to M times the first reference current, where M is a positive integer;
   a pass/fail checking unit configured to determine a program outcome with respect to the memory cells based on the count result and to output a pass signal or a fail signal based on the determined program outcome;
   a reference current generating unit configured to generate a first reference current signal corresponding to the first reference current and a second reference current signal corresponding to the second reference current such that the second reference current is M times the first reference current; and
   a controller configured to generate a ratio control signal used to control a ratio of the first reference current and the second reference current according to a maximum number of fail bits to be detected, and provide the ratio control signal to the reference current generating unit.

* * * * *